(12) United States Patent
Lee et al.

(10) Patent No.: US 12,342,548 B2
(45) Date of Patent: Jun. 24, 2025

(54) MEMORY DEVICE AND MANUFACTURING METHOD THEREOF

(71) Applicant: Taiwan Semiconductor Manufacturing Company, Ltd., Hsinchu (TW)

(72) Inventors: Chien-Min Lee, Hsinchu County (TW); Cheng-Hsien Wu, Hsinchu (TW); Cheng-Chun Chang, Taoyuan (TW); Elia Ambrosi, Hsinchu (TW); Hengyuan Lee, Hsinchu (TW); Ying-Yu Chen, Yilan (TW); Xinyu Bao, Fremont, CA (US); Tung-Ying Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 607 days.

(21) Appl. No.: 17/669,313

(22) Filed: Feb. 10, 2022

(65) Prior Publication Data

US 2022/0415968 A1    Dec. 29, 2022

Related U.S. Application Data

(60) Provisional application No. 63/214,274, filed on Jun. 24, 2021.

(51) Int. Cl.
*H10B 63/00* (2023.01)
*H10N 70/00* (2023.01)

(52) U.S. Cl.
CPC ............ *H10B 63/24* (2023.02); *H10B 63/84* (2023.02); *H10N 70/026* (2023.02); *H10N 70/8828* (2023.02)

(58) Field of Classification Search
None
See application file for complete search history.

(56) References Cited

U.S. PATENT DOCUMENTS

2020/0395410 A1\* 12/2020 Grobis ............... G11C 13/0004

\* cited by examiner

*Primary Examiner* — Feifei Yeung Lopez
(74) *Attorney, Agent, or Firm* — JCIPRNET

(57) ABSTRACT

An ovonic threshold switch (OTS) selector and a memory device including the OTS selector is provided. The OTS selector includes a switching layer formed of a GeCTe compound further doped with one or both of nitrogen and silicon, and exhibits improved thermal stability and electrical performance.

20 Claims, 24 Drawing Sheets

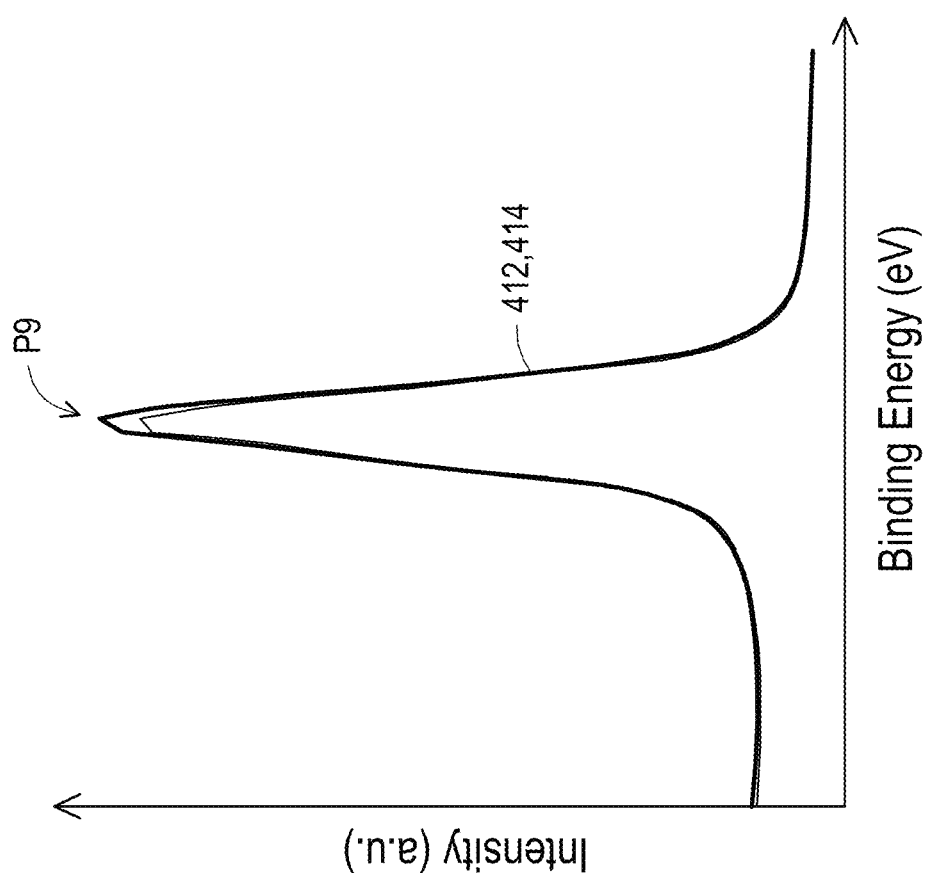

MEMORY DEVICE AND MANUFACTURING METHOD THEREOF

CROSS-REFERENCE TO RELATED APPLICATION

This application claims the priority benefit of U.S. provisional application Ser. No. 63/214,274, filed on Jun. 24, 2021. The entirety of the above-mentioned patent application is hereby incorporated by reference herein and made a part of this specification.

BACKGROUND

With advances in digital technology, there is a greater demand for a nonvolatile memory device with higher capacity, less writing power, higher writing/reading speed, and longer service life. In order to meet the demand, refinement of a flash memory has been progressed. On the other hand, a nonvolatile memory device including memory cells each having a resistance variable element has been researched and developed.

Mostly, each of these nonvolatile memories has field effect transistors (FETs) that connect and disconnect the resistance variable elements from a driving circuit. The FETs have high on/off ratio and prevent leakage current from passing through the unselected memory cells. However, since a FET is a three-terminal device, controlling access of the resistance variable elements by the FETs can significantly limit design flexibility and integration level in creating these nonvolatile memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4D is a diagram showing Te3d$^5$ (3d$^5$ orbital of tellurium) XPS spectra of the GeCTe compound and the nitrogen doped GeCTe compound.

DETAILED DESCRIPTION

Figure 1A:
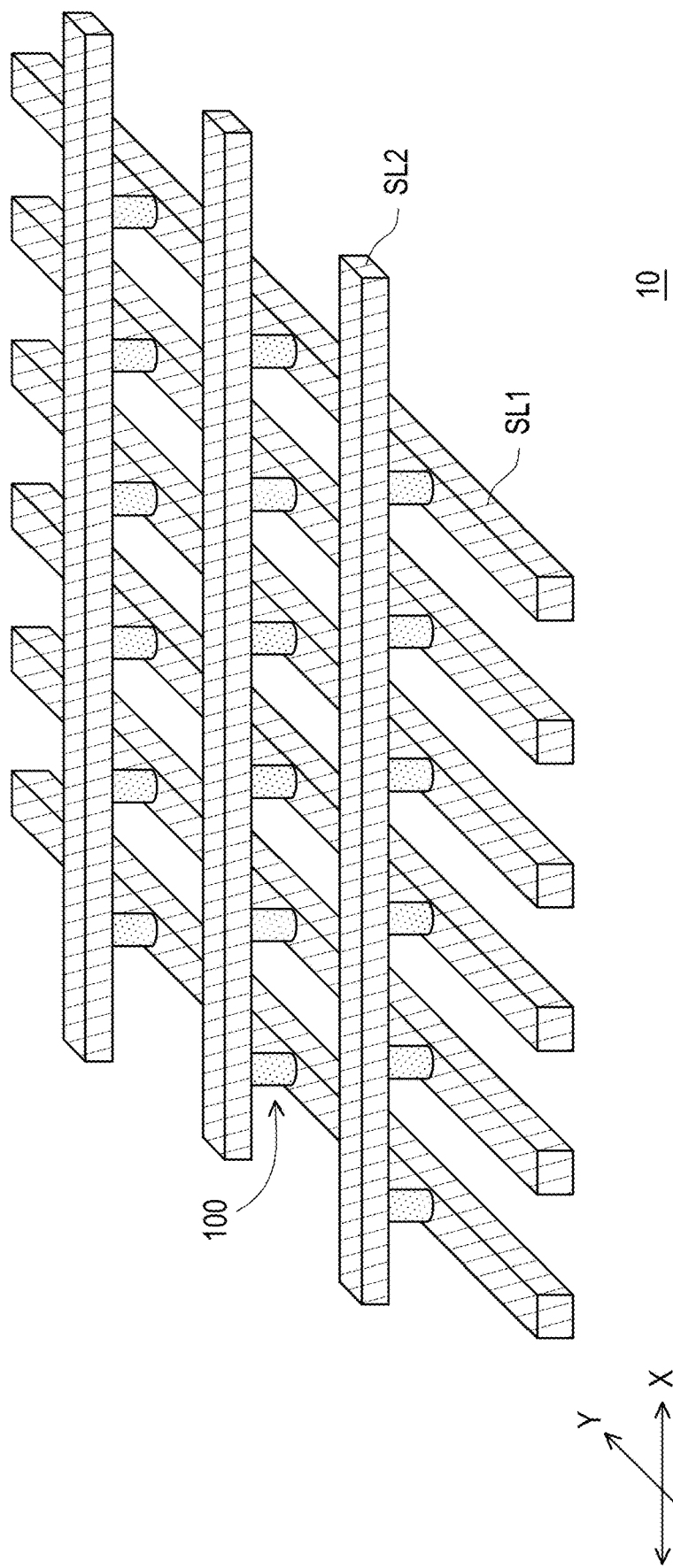
FIG. 1A is a schematic three-dimensional view illustrating a memory array, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic three-dimensional view illustrating a memory array 10, according to some embodiments of the present disclosure.

Referring to FIG. 1A, the memory array 10 includes memory cells 100 arranged along columns and rows. The memory cells 100 in each column are arranged along a direction Y, while the memory cells 100 in each row are arranged along a direction X intersected with the direction Y. The memory cells 100 are defined at intersections of first signal lines SL1 and second signal lines SL2 running over and intersecting with the first signal lines SL1. The first signal lines SL1 may be connected to or functioned as bottom terminals of the memory cells 100, while the second signal lines SL2 may be connected to or functioned as top terminals of the memory cells 100. The first signal lines SL1 may be referred as bit lines, while the second signal lines SL2 may be referred as word lines. Alternatively, the first signal lines SL1 may be referred as word lines, while the second signal lines SL2 may be referred as bit lines. In some embodiments, as shown in FIG. 1A, the first signal lines SL1 extend along the direction Y, while the second signal lines SL2 extend along the direction X. In these embodiments, each first signal line SL1 may connect the bottom terminals of a column of the memory cells 100, or functioned as a common bottom terminal for a column of the memory cells 100. In addition, each second signal line SL2 may connect the top terminals of a row of the memory cells 100, or functioned as a common top terminal for a row of the memory cells 100. However, the extending directions of the first and second signal lines SL1, SL2 may be swapped or altered, as long as the memory cells 100 are formed at intersections of the first and second signal lines SL1, SL2.

Figure 1B:
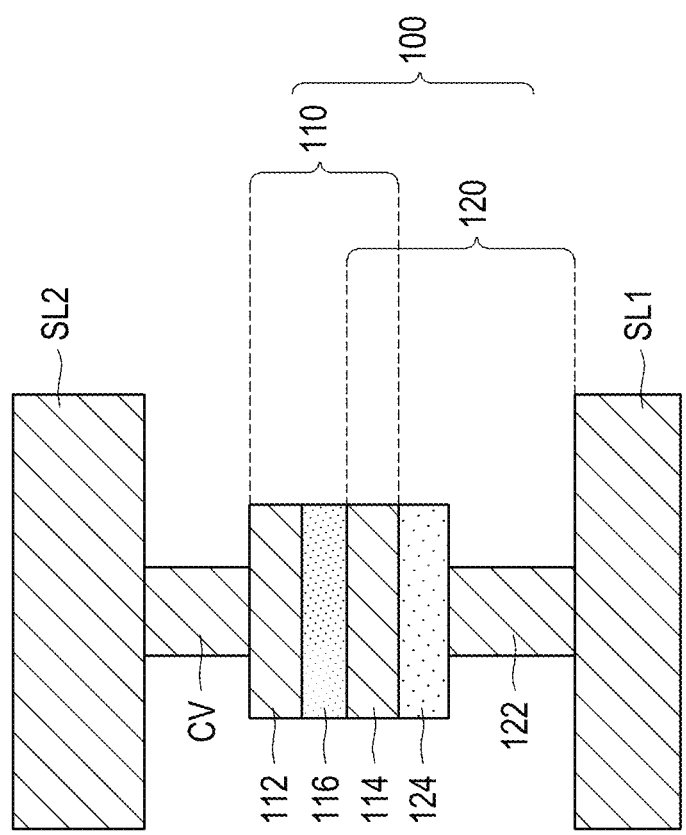
FIG. 1B is a cross-sectional view schematically illustrating a memory cell in a memory array, according to some embodiments of the present disclosure.

FIG. 1B is a cross-sectional view schematically illustrating a memory cell 100 in the memory array 10, according to some embodiments of the present disclosure.

Referring to FIG. 1A and FIG. 1B, each memory cell 100 may include a selector 110 and a resistance variable storage element 120. The selector 110 is a two-terminal switching device, and one of the terminals of the selector 110 is shared with the resistance variable storage element 120. In some embodiments, an electrode 112 is functioned as a top terminal of the selector 110, and may be coupled to the second signal line SL2 through a conductive via CV. In addition, an electrode 114 may be functioned as a bottom terminal of the selector 110, and may be shared with the resistance variable storage element 120. The electrodes 112, 114 are each formed of a conductive material. As examples, candidates of the conductive material may include Cu, W, TiN, TaN, Ru, AlN, Co, C, the like and combinations thereof.

A switching layer 116 may be sandwiched between the electrodes 112, 114. An electrical resistance across the switching layer 116 may be altered during operation of the selector 110. When the switching layer 116 is in a low resistance state, the selector 110 is referred as being turned on, and the resistance variable storage element 120 becomes accessible. On the other hand, when the switching layer 116 is in a high resistance state, the selector 110 is described as in an off state, and the resistance variable storage element 120 is inaccessible. In some embodiments, the selector 110 is an ovonic threshold switch (OTS) selector. In these embodiments, when a voltage bias applied across the switching layer 116 reaches a threshold voltage, a conductive path may be formed through the switching layer 116, and the switching layer 116 is in the low resistance state. On the other hand, when the voltage bias does not reach the threshold voltage or falls below a holding voltage from above the threshold voltage, the conductive path may not continuously extend through the switching layer 116, and the switching layer 116 is in the high resistance state. As will be further described, the switching layer 116 includes a chalcogenide compound.

The resistance variable storage element 120 may be a two-terminal device as well. As described above, the electrode 114 may be functioned as a common terminal of the selector 110 and the resistance variable storage element 120. In some embodiments, an electrode 122 is functioned as the other terminal of the resistance variable storage element 120, and may be coupled to the first signal line SL1. As similar to the electrodes 112, 114, the electrode 122 is formed of a conductive material as well. As examples, candidates of the conductive material may include Cu, W, TiN, TaN, Ru, AlN, Co, C, the like and combinations thereof.

A storage layer 124 lies between the two terminals of the resistance variable storage element 120 (e.g., the electrodes 114, 122). Microstructure in the storage layer 124 may be altered according to input signals applied across the storage layer 124. In corresponding to the microstructure change, the storage layer 124 may be switched between a high resistance state and a low resistance state. Further, the resistance state of the storage layer 124 may be held even when the input signal is removed, and the resistance variable storage element 120 may be referred as a non-volatile memory device. In some embodiments, the resistance variable storage element 120 is a phase change non-volatile memory device. In these embodiments, a crystallinity of the storage layer 124 may be increased when the storage layer 124 is turned to the low resistance state. On the other hand, when the storage layer 124 is in the high resistance state, the storage layer 124 may be amorphous or may have a rather low crystallinity. In some embodiments, the storage layer 124 is formed of a chalcogenide compound. The chalcogenide compound may include Ge, Te and Sb. For instance, the chalcogenide material may be GeSbTe, such as $Ge_2Sb_2Te_5$ (GST225), $Ge_4Sb_2Te_4$ (GST424), $Ge_4Sb_6Te_7$ (GST467) or so forth. As other examples, the chalcogenide may include $Ti_{0.4}Sb_2Te_3$, supper lattice $Sb_2Te_3/TiTe_2$, supper lattice $GeTe/Sb_2Te_3$, supper lattice $Ti_2Te/Sb_2Te_3$ or so forth). In alternative embodiments, the storage layer 124 is a dielectric layer, such as a high-k dielectric layer. In these alternative embodiments, a conductive filament may be formed through the storage layer 124 when the storage layer 124 is at the low resistance, while such conductive filament may be cut off when the storage layer 124 is switched to the high resistance state.

In some embodiments, the electrode 122 has a footprint area smaller than a footprint area of each of the storage layer 124, the electrodes 114, 112 and the switching layer 116. In these embodiments, a sidewall of the electrode 122 may be laterally recessed from sidewalls of the storage layer 124, the electrodes 114, 112 and the switching layer 116. In alternative embodiments, the sidewall of the electrode 122 is substantially coplanar with the sidewalls of the storage layer 124, the electrodes 114, 112 and the switching layer 116.

Figure 1C:
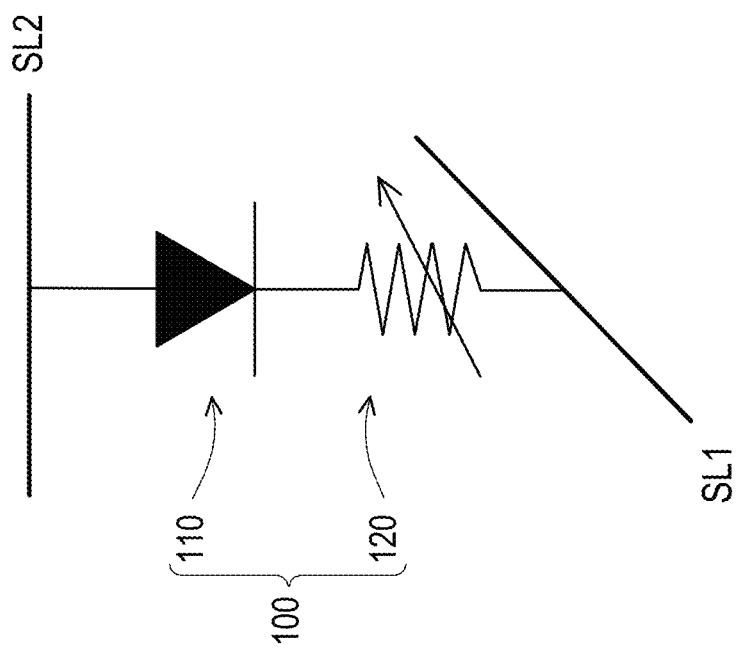
FIG. 1C is an equivalent circuit of a memory cell, according to some embodiments of the present disclosure.

FIG. 1C is an equivalent circuit of a memory cell 100, according to some embodiments of the present disclosure.

Referring to FIG. 1B and FIG. 1C, the selector 110 is schematically indicated by a diode in the equivalent circuit, as a diode is also a two-terminal switching device. However, the selector 110 may be bi-directional, and may be actually presented by two diodes connected back to back. In addition, the resistance variable storage element 120 is indicated by a variable resistor in the equivalent circuit, as a variable resistor also has an alterable resistance. As shown in FIG. 1C, the selector 110 and the resistance variable storage element 120 are serially connected between a first signal line SL1 and a second signal line SL2, and share a common terminal. Since the selector 110 and the resistance variable storage element 120 are connected in series, a voltage applied across the memory cell 100 is divided across the selector 110 and the resistance variable storage element 120.

During operation of the memory cell 100, a voltage pulse may be provided to one of the corresponding first and second signal lines SL1, SL2, and the other one of these first and second signal lines SL1, SL2 may receive a reference voltage (e.g., a ground voltage). In order to program the resistance variable storage element 120, the voltage pulse must reach a voltage high enough for ensuring that a voltage across the selector 110 is greater than the threshold voltage of the selector 110, such that the selector 110 can be turned on. Accordingly, the resistance variable storage element 120 is accessible, and can be programmed. On the other hand, in some embodiments, the voltage pulse may be provided with a lower peak voltage during a read operation, such that the selector 110 can be turned on when a low resistance state is stored in the resistance variable storage element 120, and may be in an off state when a high resistance state is stored in the resistance variable storage element 120. In these embodiments, by detecting whether a conductive path is established through the selector 110 and the resistance variable storage element 120, the resistance state stored in the resistance variable storage element 120 can be identified. In alternative embodiments, the selector 110 is turned on even during a read operation for sensing a high resistance state stored in the resistance variable storage element 120.

Figure 1D:
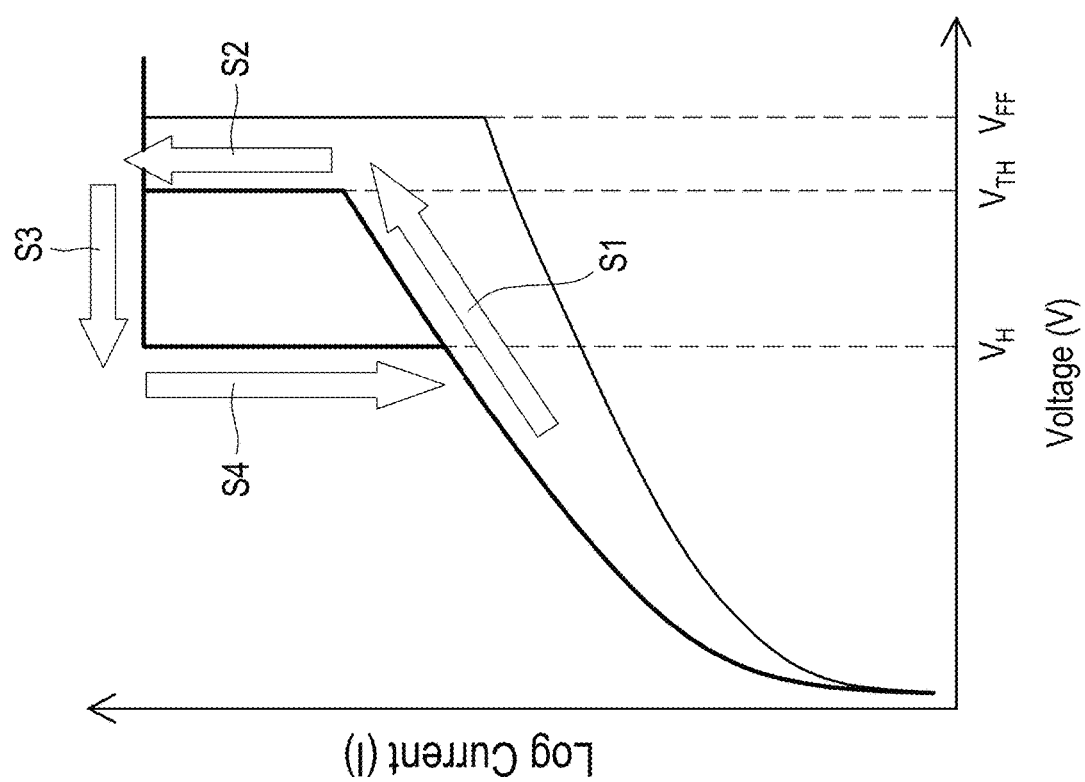
FIG. 1D is a current-voltage (I-V) curve illustrating an operation cycle of a selector, according to some embodiments of the present disclosure.

FIG. 1D is a current-voltage (I-V) curve illustrating an operation cycle of a selector 110, according to some embodiments of the present disclosure.

Referring to FIG. 1D, each operation cycle of the selector 110 may have multiple stages. Along a timeline, a voltage applied across the selector 110 may increase during a first stage S1, and then decrease at a third stage S3. At the first stage S1, a current passing through the selector 110 stays low, and the selector 110 is in a high resistance state (i.e., an off state). When the voltage is raised over a threshold voltage $V_{TH}$ of the selector 110, operation of the selector 110 enters a second stage S2. At the second stage S2, the current passing through the selector 110 significantly increases as the voltage across the selector 110 is slightly raised or kept at the threshold voltage $V_{TH}$, and the selector 110 is being switched to a low resistance state (i.e., an on state). When the current is saturate, operation of the selector 110 enters the third stage S3, at which the current passing through the selector 110 remains high, and the selector 110 is in the low resistance state (i.e., the on state). A fourth stage S4 is entered as the voltage across the selector 110 is lowered below a holding voltage $V_H$, and the current passing through the selector 110 decreases dramatically as the voltage applied across the selector 110 is slightly lowered. At the fourth stage S4, the selector 110 is being switched back to the high resistance state (i.e., the off state), and an operation cycle may be completed.

When the selector 110 is turned on at the third stage S3, the resistance variable storage element 120 coupled to the selector 110 can be programmed, or a read current may pass through the resistance variable storage element 120 and the selector 110. On the other hand, the selector 110 returns to the first stage S1 when a programming operation of the resistance variable storage element 120 or detection of the read current is over. In addition, the selector 110 may stay at the first stage S1 while not being selected, or in a condition that the resistance variable storage element 120 at a high resistance state is subjected to a read operation.

Prior to the operation cycles respectively described above, a conductive path may be initially formed across the switching layer 116 of the selector 110 when the voltage applied to the switching layer 116 reaches a first fire voltage $V_{FF}$. After the initially formed conductive path is cut off by pulling down the voltage applied across the selector 110 to the holding voltage $V_H$ from the first fire voltage, the operation cycles respectively described above can be performed. During each of these operation cycles, the conductive path may be reconstructed and then cut off. The first fire voltage may be greater than the threshold voltage $V_{TH}$, which is higher than the holding voltage $V_H$.

Figure 2A:
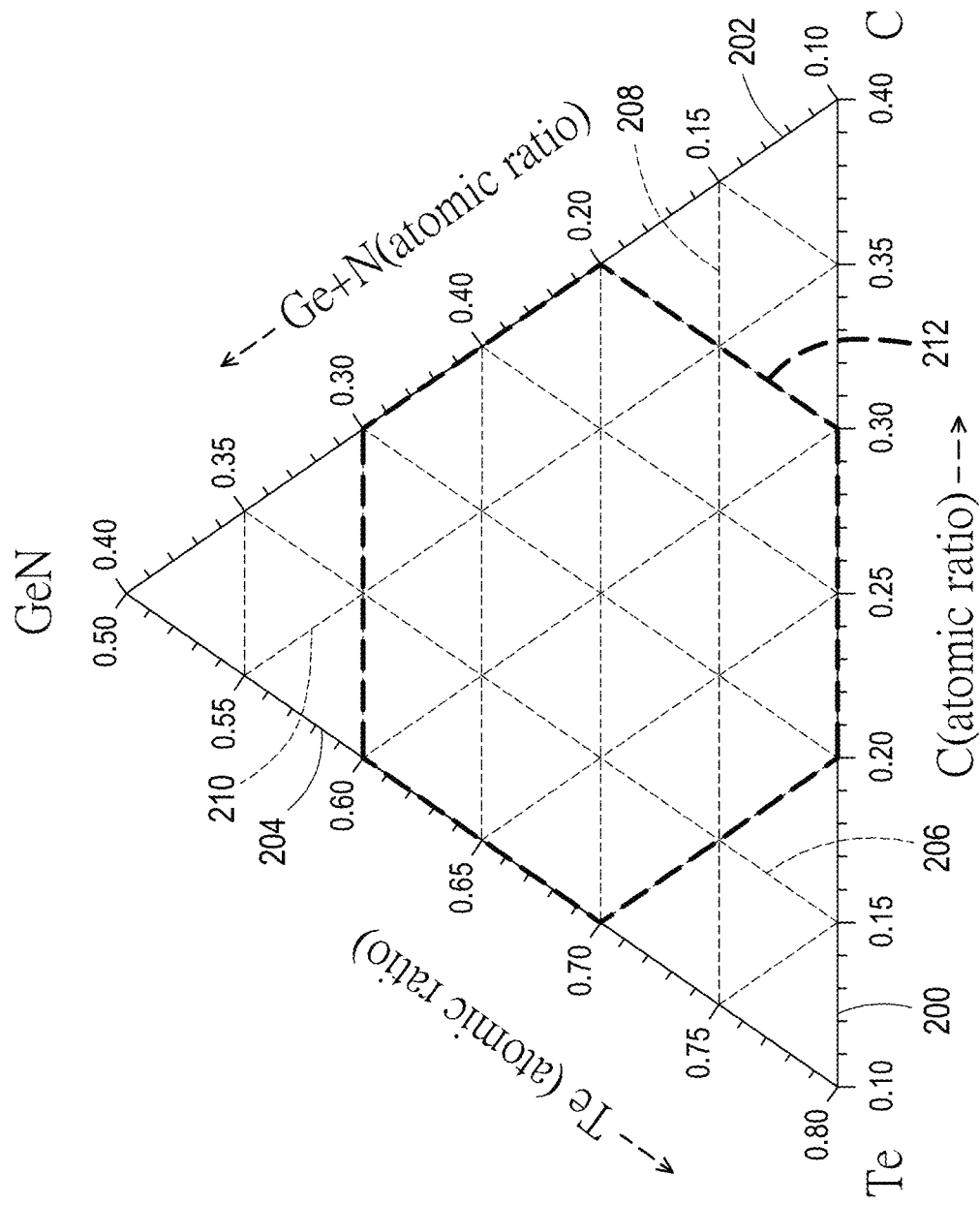
FIG. 2A is a composition diagram illustrating a composition of a switching layer of a selector, according to some embodiments of the present disclosure.

FIG. 2A is a composition diagram illustrating a composition of the switching layer 116 of the selector 110, according to some embodiments of the present disclosure.

Referring to FIG. 1B and FIG. 2A, in some embodiments, the switching layer 116 is formed of a nitrogen doped GeCTe chalcogenide compound. As compared to a GeSiAsSe chalcogenide compound also used for a switching layer of an OTS selector, a GeCTe chalcogenide compound is free of a toxic element arsenic, and has a much lower threshold voltage. By further incorporating nitrogen into the GeCTe compound, material properties of the GeCTe compound can be further improved. As will be further described, Ge in the GeCTe material system appears to be replaced by the incorporated nitrogen. Accordingly, contents of nitrogen and germanium in the nitrogen doped GeCTe compound are represented by a total atomic ratio of nitrogen and germanium in the ternary composition diagram shown in FIG. 2A. In the diagram of FIG. 2A, points falling on an axis 200 correspond to binary mixtures of tellurium and carbon, and labels of the axis 200 indicate an atomic ratio of carbon in the binary mixtures. Points falling on an axis 202 correspond to ternary mixtures of carbon, nitrogen and germanium, and labels of the axis 202 indicate a total atomic ratio of nitrogen and germanium in the ternary mixtures. In addition, points falling on an axis 204 correspond to ternary mixtures of nitrogen, germanium and tellurium, and labels of the axis 204 indicate an atomic ratio of tellurium in the ternary mixtures. Points not lying on any of the axes 200, 202, 204 correspond to quaternary mixtures of tellurium, carbon, nitrogen and germanium. The compositions of these quaternary mixtures represented by these off-axis points may be read by following oblique lines 206 joining the axis 200 to determine the atomic ratio of carbon on the axis 200, following horizontal lines 208 joining the axis 202 to determine the total atomic ratio of nitrogen and germanium on the axis 202, and following oblique line 210 joining the axis 204 to determine the atomic ratio of tellurium on the axis 204. A region 212 enclosed in the ternary composition diagram indicates atomic ratio ranges of nitrogen, germanium, carbon, tellurium in the nitrogen doped GeCTe compound according to some embodiments where an OTS selector having a switching layer formed of such nitrogen doped GeCTe has outstanding performances. The nitrogen doped GeCTe compound can be alternatively represented by $N_W Ge_X C_Y Te_Z$, where "W" indicates the atomic ratio of nitrogen, "X" indicates the atomic ratio of germanium, "Y" indicates the atomic ratio of carbon, and "Z" indicates the atomic ratio of tellurium. A summation of "W", "X", "Y", "Z" equals to 1. In those embodiments where the composition of $N_W Ge_X C_Y Te_Z$ is indicated by the region 212 in the ternary composition diagram, a summation of "W" and "X" may range from about 0.10 to about 0.30, "Y" may range from about 0.10 to about 0.30, and "Z" may range from about 0.50 to about 0.70.

Figure 2B:
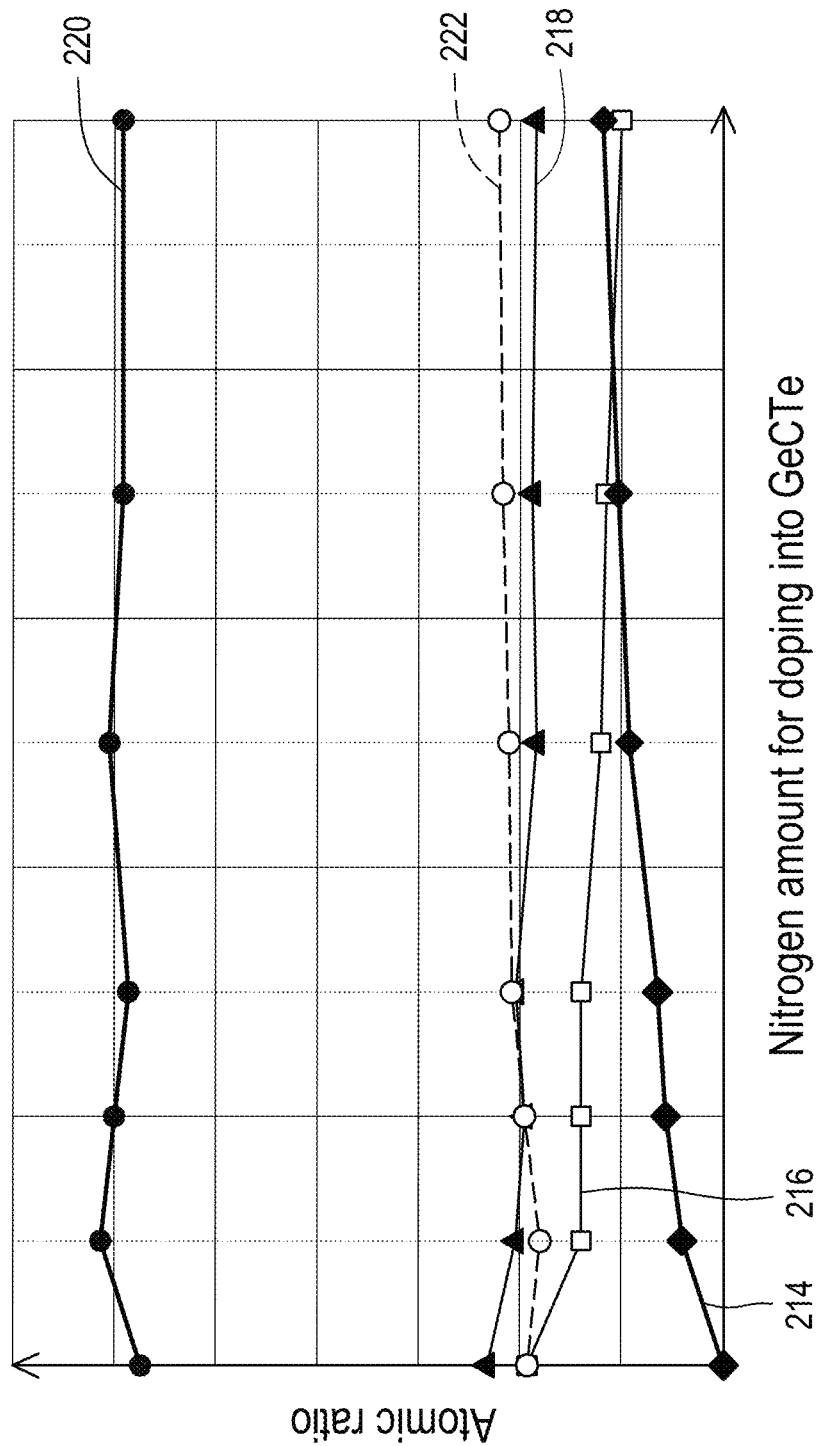
FIG. 2B is a diagram illustrating composition variation of a nitrogen doped GeCTe compound with respect to increasing amount of nitrogen used for forming the nitrogen doped GeCTe compound, according to some embodiments of the present disclosure.

FIG. 2B is a diagram illustrating composition variation of a nitrogen doped GeCTe compound with respect to increasing amount of nitrogen used for forming the nitrogen doped GeCTe compound, according to some embodiments of the present disclosure.

A horizontal axis shown in FIG. 2B indicates an amount of nitrogen used for doping into a GeCTe compound, while a vertical axis shown in FIG. 2B indicates atomic ratios of nitrogen, germanium, carbon, tellurium in the nitrogen doped GeCTe compound. A curve 214 shows how the content of nitrogen in the nitrogen doped GeCTe compound varies in corresponding to increasing amount of nitrogen used for forming the nitrogen doped GeCTe compound. Similarly, a curve 216 shows variation of germanium content responding to the raise of nitrogen dosage; a curve 218 shows variation of carbon content responding to the raise of nitrogen dosage; and a curve 220 shows variation of tellurium content responding to the raise of nitrogen dosage. As indicated by the curves 218, 220, the contents of carbon and tellurium in the nitrogen doped GeCTe compound are barely affected by the amount of nitrogen used for forming the nitrogen doped GeCTe compound. On the other hand, as indicated by the curves 214, 216, both of the contents of nitrogen and germanium in the nitrogen doped GeCTe compound vary in corresponding to increasing amount of nitrogen used for forming the nitrogen doped GeCTe compound. Particularly, the content of nitrogen in the nitrogen doped GeCTe compound increases as raise of nitrogen dosage, while the content of germanium in the nitrogen doped GeCTe compound is reduced as raise of nitrogen dosage. As an explanation, germanium in the nitrogen doped GeCTe compound may be substituted by nitrogen. The higher dosage of nitrogen, a greater portion of the germanium content in the nitrogen doped GeCTe compound may be replaced by nitrogen. As a support, a summation of the contents of nitrogen and germanium in the nitrogen doped GeCTe compound, which is indicated by a dash line 222, remain substantially unchanged as nitrogen dosage is raised. In some embodiments, about 20% to about 55% of the germanium content in the nitrogen doped GeCTe compound is substituted by nitrogen. In these embodiments, a ratio of "W" in $N_W Ge_X C_Y Te_Z$ over a summation of "W" and "X" in $N_W Ge_X C_Y Te_Z$ (i.e., "W"/("W"+"X")) may range from about 0.20 to about 0.55. In those embodiments where the composition of $N_W Ge_X C_Y Te_Z$ is indicated by the region 212 in position of $N_W Ge_X C_Y Te_Z$ is indicated by the region 212 in the ternary composition diagram as shown in FIG. 2A, "W" in $N_W Ge_X C_Y Te_Z$ may range from about 0.02 to about 0.165; "X" in $N_W Ge_X C_Y Te_Z$ may range from about 0.045 to about 0.24; "Y" in $N_W Ge_X C_Y Te_Z$ may range from about 0.10 to about 0.30; and "Z" in $N_W Ge_X C_Y Te_Z$ may range from about 0.50 to about 0.70.

Figure 3A:
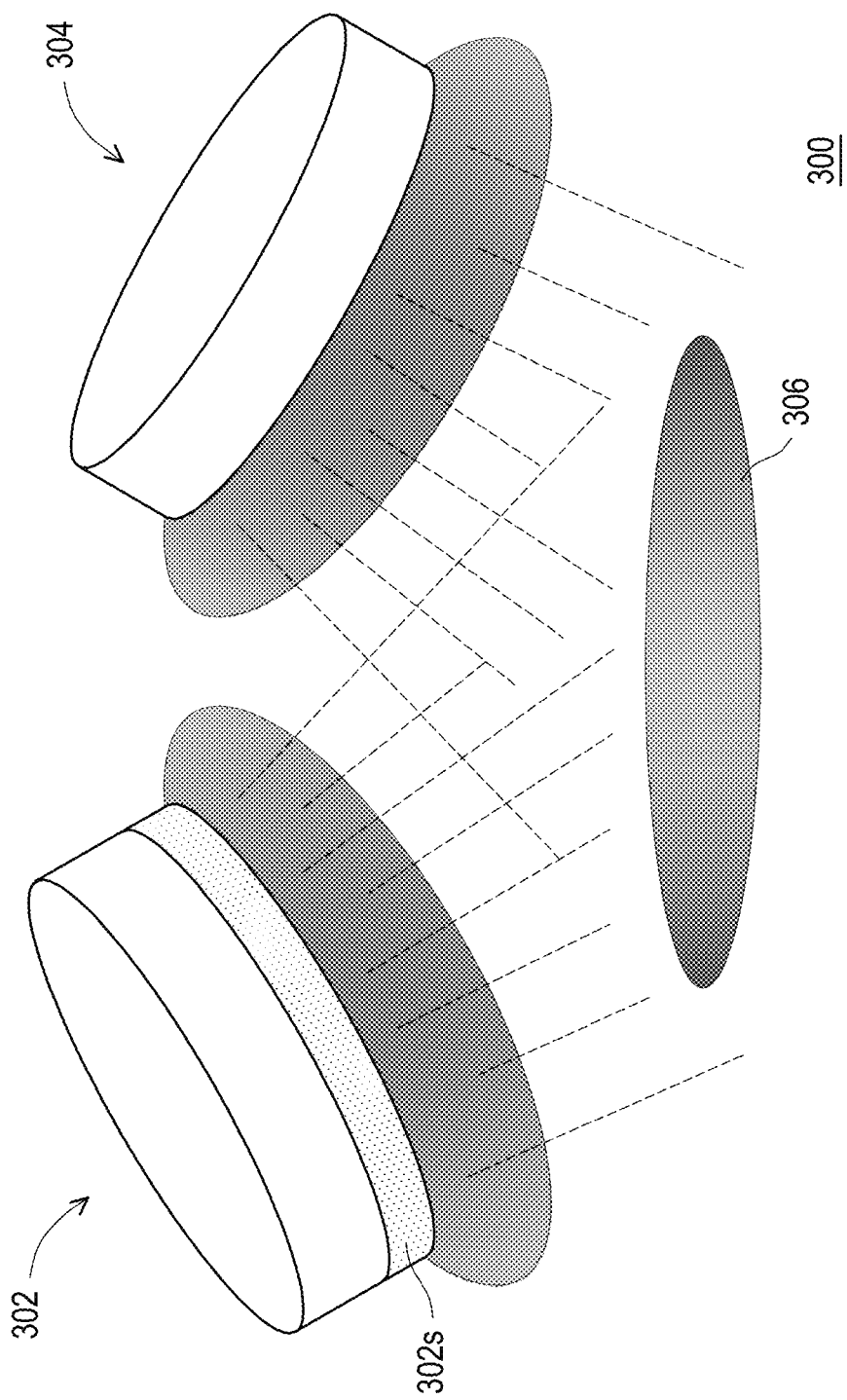
FIG. 3A is a schematic diagram illustrating a sputtering process used for depositing the nitrogen doped GeCTe compound for forming a switching layer, according to some embodiments of the present disclosure.

FIG. 3A is a schematic diagram illustrating a sputtering process 300 used for depositing the nitrogen doped GeCTe compound for forming the switching layer 116, according to some embodiments of the present disclosure.

Referring to FIG. 3A, in some embodiments, the nitrogen doped GeCTe compound for forming the switching layer 116 is deposited by using a sputtering process 300. A germanium target 302 and a tellurium carbide target 304 may be provided in a chamber for performing the sputtering process 300. During the sputtering process 300, nitrogen gas and sputtering gas are introduced into the chamber, and may be ionized in the chamber. The ionized nitrogen gas may selectively react with the germanium target 302, such that a surface portion 302s of the germanium target 302 may be incorporated with nitrogen. In other words, the surface portion 302s of the germanium target 302 may turn into germanium nitride ($Ge_{(1-X)}N_X$). On the other hand, the sputtering gas may include argon gas. The ionized sputtering gas may strike both of the germanium target 302 and the tellurium carbide target 304, and atoms in the germanium target 302 and the tellurium carbide target 304 may be ejected and deposited on a workpiece 306 (e.g., a wafer). Since the surface portion 302s of the germanium target 302 is incorporated with nitrogen, germanium and nitrogen atoms may be ejected from the germanium target 302. In addition, carbon and tellurium atoms may be ejected from the tellurium carbide target 304. As a result, the ejected germanium, nitrogen, carbon and tellurium atoms may be deposited on the workpiece 306 to form a layer of the nitrogen doped GeCTe compound. In some embodiments, the workpiece 306 is kept at an elevated temperature (e.g., 100° C. to 200° C.) during the deposition process. Further, in some embodiments, a post annealing process may be performed on the deposited nitrogen doped GeCTe compound.

Alternatively, only the sputtering gas is introduced into the chamber. As a result, the germanium target 302 may not be incorporated with nitrogen, and only germanium atoms could be ejected from the germanium target 302. Therefore, the atoms ejected and deposited on the workpiece 306 may include germanium, carbon and tellurium atoms, but may not include nitrogen atoms. In these embodiments, a layer of a GeCTe compound may be formed on the workpiece 306. After the sputtering process, the deposited layer of the GeCTe compound may be subjected to a nitridation process, and the GeCTe compound may be incorporated with nitrogen to form the nitrogen doped GeCTe compound. As an example, nitrogen radicals generated from nitrogen plasma may be used for the nitridation process, or the as-deposited GeCTe compound may be directly subjected to nitrogen plasma treatment for further incorporating nitrogen. In these embodiments, total amount of germanium and nitride in the nitrogen incorporated GeCTe compound may not remain constant as dosage of nitrogen varies.

Figure 3B:
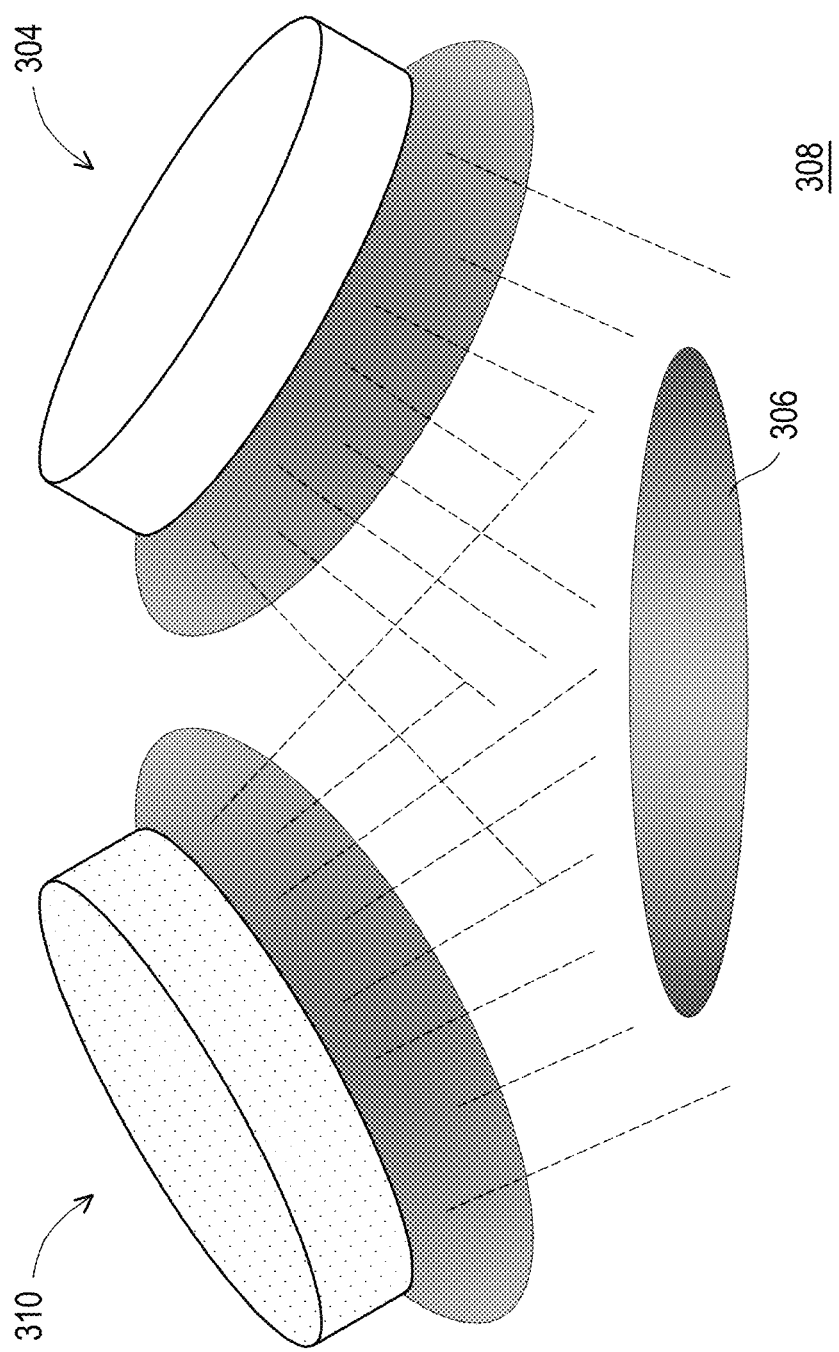
FIG. 3B is a schematic diagram illustrating a sputtering process used for depositing the nitrogen doped GeCTe compound for forming a switching layer, according to some embodiments of the present disclosure.

FIG. 3B is a schematic diagram illustrating a sputtering process 308 used for depositing the nitrogen doped GeCTe compound for forming the switching layer 116, according to some embodiments of the present disclosure. The sputtering process 308 is similar to the sputtering process 300 as described with reference to FIG. 3A. Therefore, only the differences between the sputtering processes 300, 308 will be described. The same or the like parts of the sputtering processes 300, 308 may not be repeated again.

Referring to FIG. 3B, a germanium nitride ($Ge_{(1-x)}N_x$) target 310 and the tellurium carbide target 304 are used in the sputtering process 308. Since the germanium nitride target 310 can provide both nitrogen and germanium atoms, nitrogen gas may not have to be introduced into the chamber for incorporating nitrogen into one or both of the targets. In other words, only the sputtering gas may be introduced into the chamber. The sputtering gas may be ionized, and the ionized sputtering gas may strike the germanium nitride target 310 and the tellurium carbide target 304. Germanium and nitrogen atoms may be ejected from the germanium nitride target 310, while carbon and tellurium atoms may be ejected from the tellurium carbide target 304. As a result, the ejected germanium, nitrogen, carbon and tellurium atoms may be deposited on the workpiece 306 to form a layer of the nitrogen doped GeCTe compound. In some embodiments, the workpiece 306 is kept at an elevated temperature (e.g., 100° C. to 200° C.) during the deposition process. Further, in some embodiments, a post annealing process may be performed on the deposited nitrogen doped GeCTe compound.

Figure 4A:
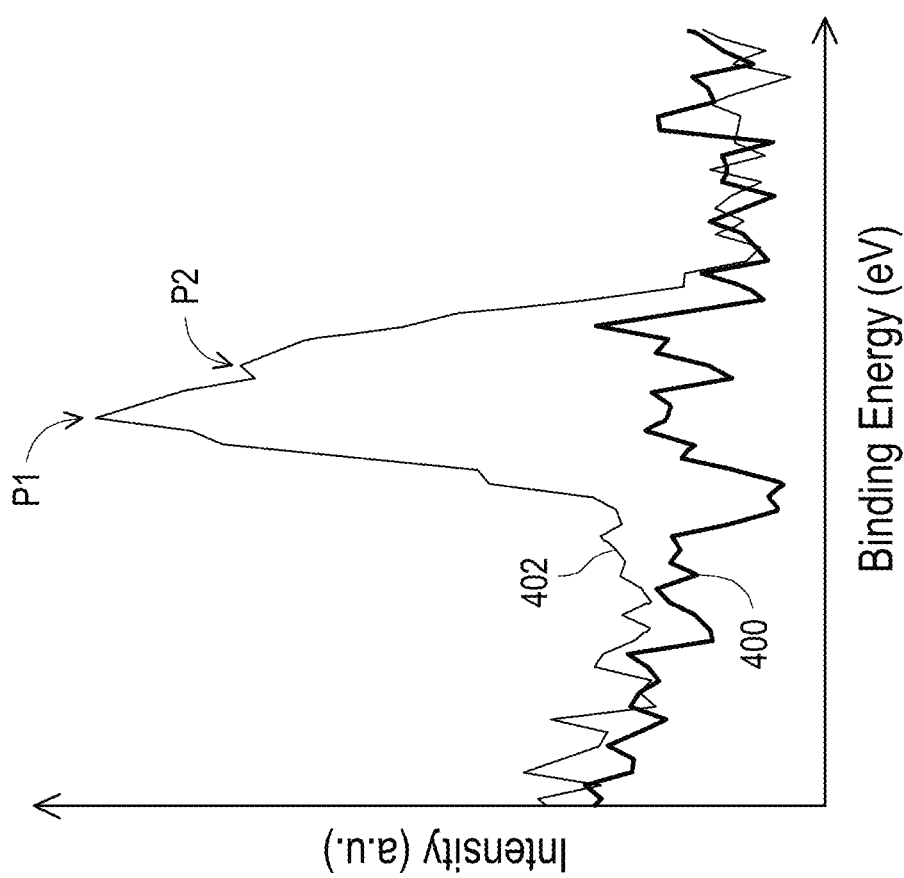
FIG. 4A is a diagram showing N1s (1s orbital of nitrogen) X-ray photoelectron spectroscopy (XPS) spectra of a GeCTe compound and a nitrogen doped GeCTe compound.

FIG. 4A is a diagram showing N1s (1s orbital of nitrogen) X-ray photoelectron spectroscopy (XPS) spectra of a GeCTe compound and a nitrogen doped GeCTe compound.

Referring to FIG. 4A, as compared to a N1s XPS spectrum 400 of a GeCTe compound, a N1s XPS spectrum 402 of a nitrogen doped GeCTe compound has peaks P1, P2. The peak P1 is identified as a result of nitrogen-carbon bonding, and the peak P2 is identified as a result of nitrogen-germanium bonding. Therefore, by incorporating nitrogen into a GeCTe compound, nitrogen atoms may establish bonds with germanium atoms and carbon atoms.

Figure 4B:
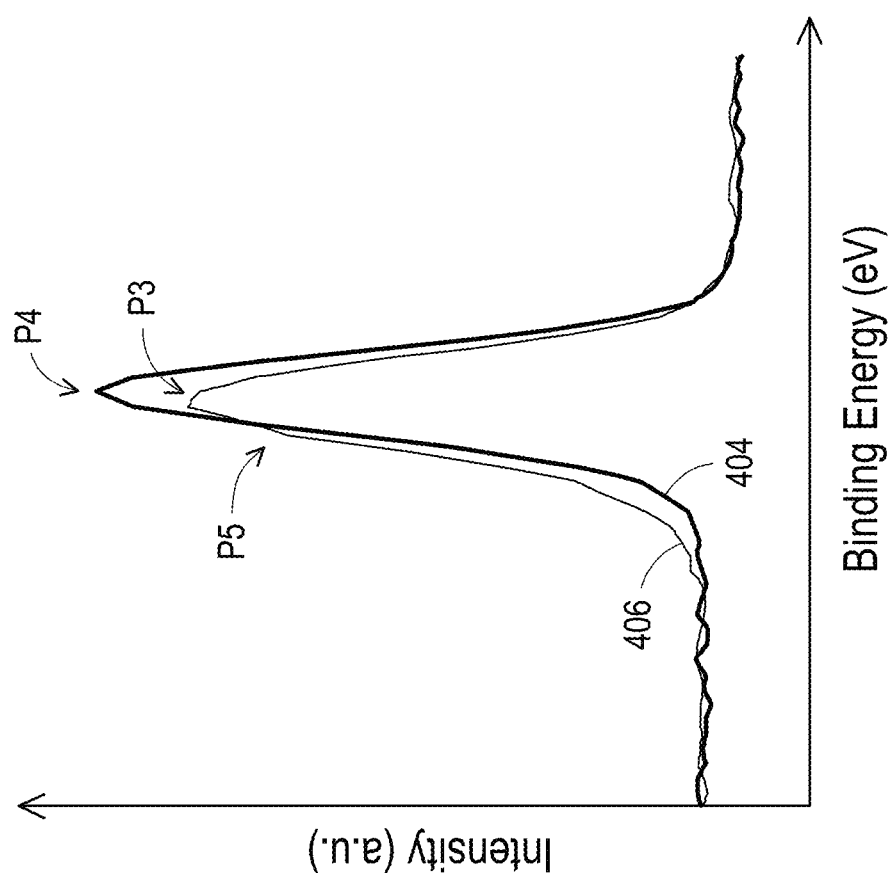
FIG. 4B is a diagram showing Ge3d (3d orbital of germanium) XPS spectra of the GeCTe compound and the nitrogen doped GeCTe compound.

FIG. 4B is a diagram showing Ge3d (3d orbital of germanium) XPS spectra of the GeCTe compound and the nitrogen doped GeCTe compound.

Referring to FIG. 4B, both a peak P3 of a Ge3d XPS spectrum 404 of the GeCTe compound and a peak P4 of a Ge3d XPS spectrum 406 of the nitrogen doped GeCTe compound indicate germanium-tellurium bonding. Further, the Ge3d XPS spectrum 406 of the nitrogen doped GeCTe compound has an additional peak P5 identified as a result of germanium-nitrogen bonding. The peak P5 is close to the peak P4, and merged with the peak P4 to form an asymmetric and broadened peak. As the Ge3d XPS spectrum 406 further has the peak P5 indicating germanium-nitrogen bonding, it is further proved that the incorporated nitrogen atoms may establish bonds with germanium atoms.

Figure 4C:
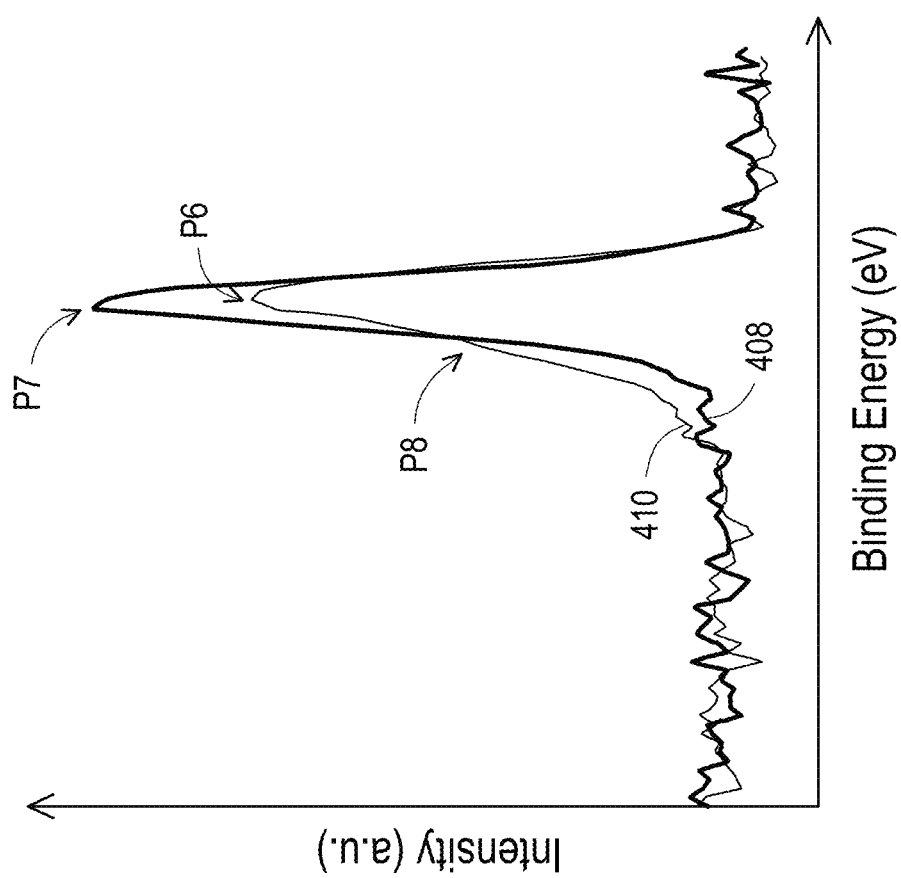
FIG. 4C is a diagram showing C1s (1s orbital of carbon) XPS spectra of the GeCTe compound and the nitrogen doped GeCTe compound.

FIG. 4C is a diagram showing C1s (1s orbital of carbon) XPS spectra of the GeCTe compound and the nitrogen doped GeCTe compound.

Referring to FIG. 4C, both a peak P6 of a C1s XPS spectrum 408 of the GeCTe compound and a peak P7 of a C1s XPS spectrum 410 of the nitrogen doped GeCTe compound indicate carbon-carbon bonding. Further, the C1s XPS spectrum 410 of the nitrogen doped GeCTe compound has an additional peak P8 identified as a result of carbon-nitrogen bonding. The peak P8 is close to the peak P7, and merged with the peak P7 to form an asymmetric and broadened peak. As the C1s XPS spectrum 410 further has the peak P8 indicating carbon-nitrogen bonding, it is further proved that the incorporated nitrogen atoms may establish bonds with carbon atoms.

FIG. 4D is a diagram showing Te3d$^5$ (3d$^5$ orbital of tellurium) XPS spectra of the GeCTe compound and the nitrogen doped GeCTe compound.

Referring to FIG. 4D, a Te3d$^5$ XPS spectrum 412 of the GeCTe compound almost matches a Te3d$^5$ XPS spectrum 414 of the nitrogen doped GeCTe compound. Such overlap may indicate absence of tellurium-nitrogen bonding. In addition, a coincident peak P9 of the Te3d$^5$ XPS spectra 412, 414 indicate tellurium-germanium bonding.

As described with reference to FIG. 4A through FIG. 4D, the nitrogen atoms incorporated into the GeCTe compound may establish bonds with germanium and carbon atoms. As a result, carbon and germanium atoms in the GeCTe material system can be further linked by the incorporated nitrogen atoms. Carbon atoms in the GeCTe material system may prefer self-linking, and form carbon chains that may result in less cross-linking structure in the GeCTe material system. By further incorporating nitrogen into the GeCTe compound to establish bonding with germanium and carbon atoms, a network structure linking different elements in the GeCTe compound can be reinforced. Due to stronger linking among elements in the nitrogen doped GeCTe compound, the nitrogen doped GeCTe compound may exhibit greater thermal stability and improved electrical performance over the GeCTe compound without nitrogen doping, as will be further described in details.

Figure 5:
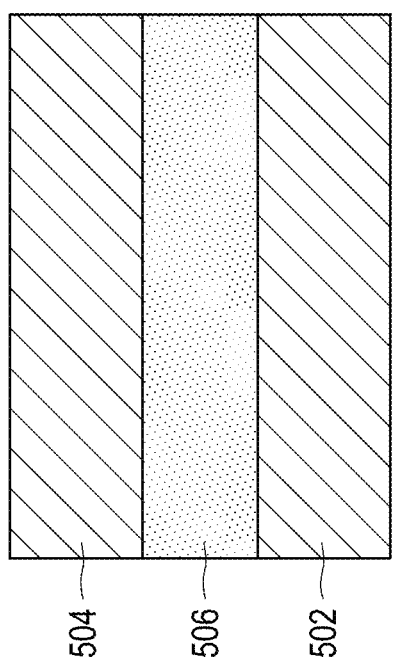
FIG. 5 is a schematic cross-sectional view illustrating one of a plurality of test structures used for a series of tests.

FIG. 5 is a schematic cross-sectional view illustrating one of a plurality of test structures 500 used for a series of tests.

Referring to FIG. 5, as similar to the selector 110 described with reference to FIG. 1B, each test structure 500 is an OTS selector, and includes electrodes 502, 504 and a switching layer 506 lying between the electrodes 502, 504. The electrodes 502, 504 are respectively formed of a conductive material. The switching layer 605 is formed of a GeCTe compound without nitrogen doping, or a GeCTe compound doped with certain amount of nitrogen. By subjecting the test structures 500 to a series of tests, effects of incorporating nitrogen into the GeCTe compound for forming the switching layer 506 can be assessed in terms of electrical performances.

In a thermal stability test, the test structures 500 are subjected to thermal annealing treatments. A process time of the thermal annealing treatments is controlled within a range from 30 minutes to 40 minutes, and the thermal annealing treatments are performed in a nitrogen ambient. In addition, a process temperature of the thermal annealing treatments varies from 250° C. to 400° C. By observing variations in threshold voltage and off-current of the test structures 500 before and after the thermal annealing treatments, thermal stability of the test structures 500 can be assessed. Results indicate that the test structures 500 having the switching layers 506 formed of the GeCTe compound (without nitrogen doping) can only sustain up to 250° C., while the test structures 500 having the switching layers 506 formed of the nitrogen doped GeCTe compound can sustain up to 400° C. Therefore, an OTS selector with a switching layer formed of a nitrogen doped GeCTe compound shows improved thermal stability over an OTS selector with a switching layer formed of a GeCTe compound without nitrogen doping.

Figure 6:
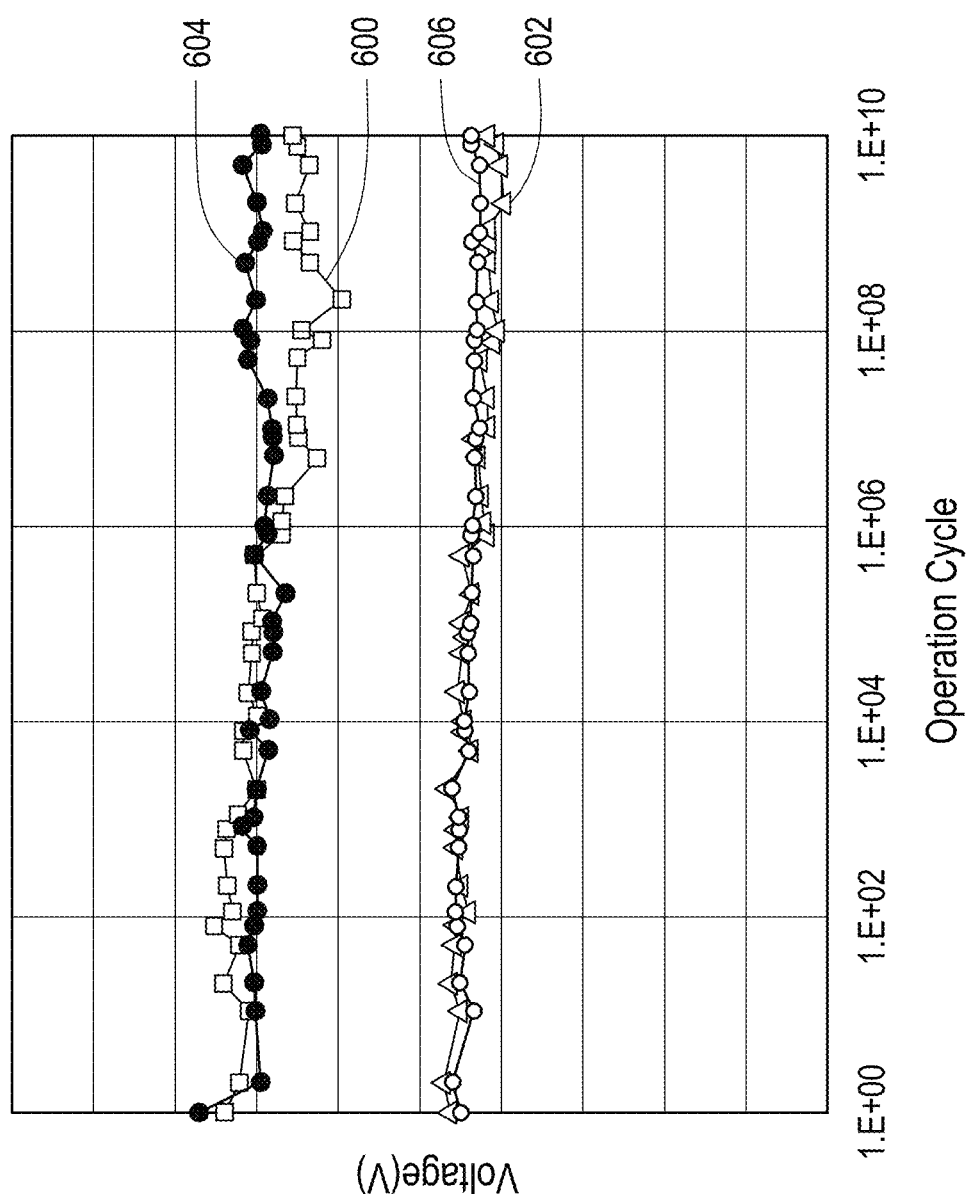
FIG. 6 is a diagram showing variations of threshold voltages and holding voltages of two test structures during repeated operations.

FIG. 6 is a diagram showing variations of threshold voltages and holding voltages of two test structures 500 during repeated operations.

Referring to FIG. 6, a data line 600 indicates threshold voltage variation of a test structure 500 with a switching layer 506 formed of a GeCTe compound (without nitrogen doping) during repeated operations, and a data line 602 indicates holding voltage variation of the test structure 500 with the switching layer 506 formed of the GeCTe compound during repeated operations. In addition, a data line 604 indicates threshold voltage variation of a test structure 500 with a switching layer 506 formed of a nitrogen doped GeCTe compound during repeated operations, and a data line 606 indicates holding voltage variation of the test structure 500 with the switching layer 506 formed of the nitrogen doped GeCTe compound during repeated operations. As indicated by the data lines 600, 604, the threshold voltage of the test structure 500 with the switching layer 506 formed of the GeCTe compound degrades after $10^6$ operation cycles, while the threshold voltage of the test structure 500 with the switching layer 506 formed of the nitrogen doped GeCTe compound maintains even after $10^{10}$ operation cycles. Therefore, an OTS selector with a switching layer formed of a nitrogen doped GeCTe compound shows improved electrical endurance over an OTS selector with a switching layer formed of a GeCTe compound without nitrogen doping.

On the other hand, as the data lines 602, 606 almost match, both of the test structure 500 with the switching layer 506 formed of the nitrogen doped GeCTe compound and the test structure 500 with the switching layer 506 formed of the GeCT compound show little variation on holding voltage during repeated operations.

Figure 7A:
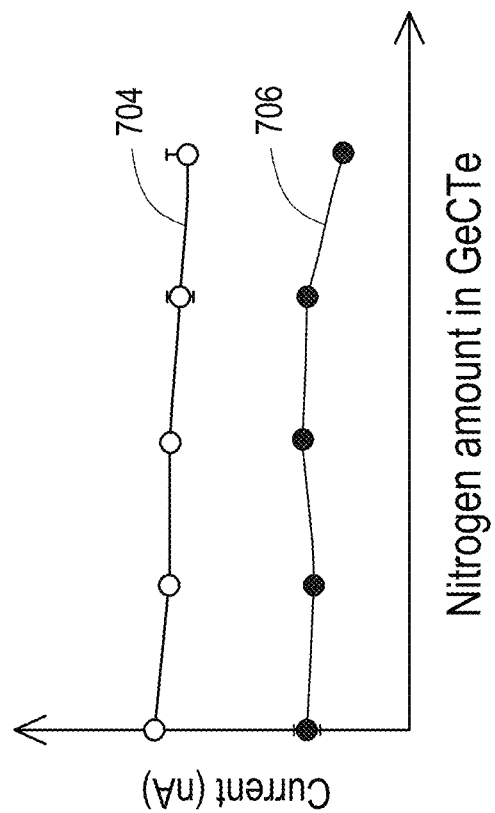
FIG. 7A is a diagram showing variations of threshold voltage and first fire voltage of several test structures with switching layers formed of GeCTe compounds having various nitrogen content.
Figure 7B:
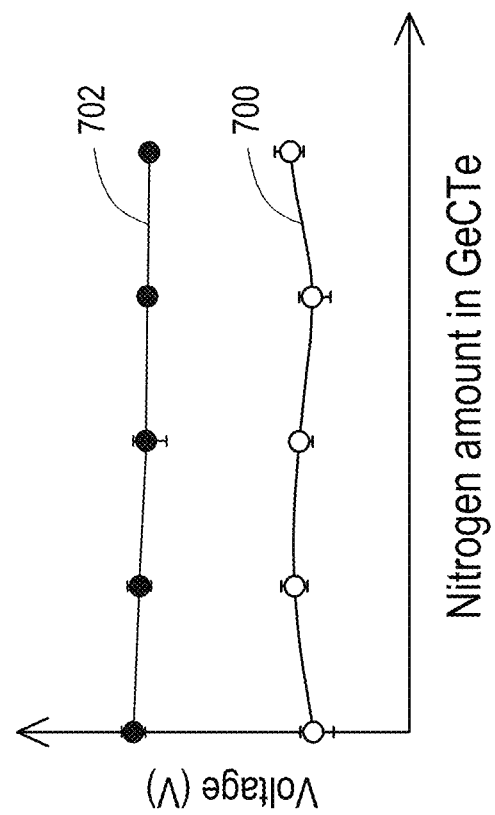
FIG. 7B is a diagram showing variations of off-current and initial current of the test structures with the switching layers formed of the GeCTe compounds having various nitrogen content.

FIG. 7A is a diagram showing variations of threshold voltage and first fire voltage of several test structures 500 with the switching layers 506 formed of GeCTe compounds having various nitrogen content. FIG. 7B is a diagram showing variations of off-current and initial current of the test structures 500 with the switching layers 506 formed of the GeCTe compounds having various nitrogen content.

The leftmost point on the horizontal axis in each of FIG. 7A and FIG. 7B indicates a test structure 500 having a switching layer 506 formed of a GeCTe compound without nitrogen doping, while other points on the horizontal axis indicate test structures 500 having switching layers 506 formed of nitrogen doped GeCTe compounds, and an amount of nitrogen doping increases along the horizontal axis.

A data line 700 shown in FIG. 7A indicates variation of threshold voltage of the test structures 500 with respect to increasing amount of nitrogen content in the switching layers 506 of the test structures 500. In addition, a data line 702 shown in FIG. 7A indicates variation of first fire voltage of the test structures 500 with respect to increasing amount of nitrogen content in the switching layers 506 of the test structures 500. As described with reference to FIG. 1D, the first fire voltage described in the present disclosure refers to a voltage applied across an OTS for forming an initial conductive path in a switching layer of the OTS selector, and is usually greater than a threshold of the OTS selector.

Further, a data line 704 shown in FIG. 7B indicates variation of off-current of the test structures 500 with respect to increasing amount of nitrogen content in the switching layers 506 of these test structures 500, and a data line 706 shown in FIG. 7B indicates variation of initial current of the test structures 500 with respect to increasing amount of nitrogen content in the switching layers 506 of the test structures 500. The off-current described in the present disclosure refers to a current measured across an OTS selector when a voltage applied across the OTS selector is half of a threshold voltage of the OTS selector. Further, the initial current described in the present disclosure refers to a current measured across an OTS selector when an initial conductive path has not been established, and a voltage applied across the OTS selector (e.g., 0.5V) is less than the first fire voltage.

As indicated by the data line 704, off-current of an OTS selector decreases as amount of nitrogen incorporated into a GeCTe compound for forming a switching layer of the OTS selector increases. Further, as indicated by the data lines 700, 704, such reduction of off-current may not be resulted from increase of threshold voltage. In other words, incorporating nitrogen into a GeCTe compound for forming a switching layer of an OTS selector may reduce off-current of the OTS selector, while preventing from raising threshold voltage of the OTS selector. Furthermore, a result of an additional test indicates that the off-current reduction is most significant when the switching layer is formed with a thickness ranging from 3 nm to 50 nm. Therefore, the switching layer 116 as described with reference to FIG. 1B may be formed with a thickness within such range.

Figure 8B:
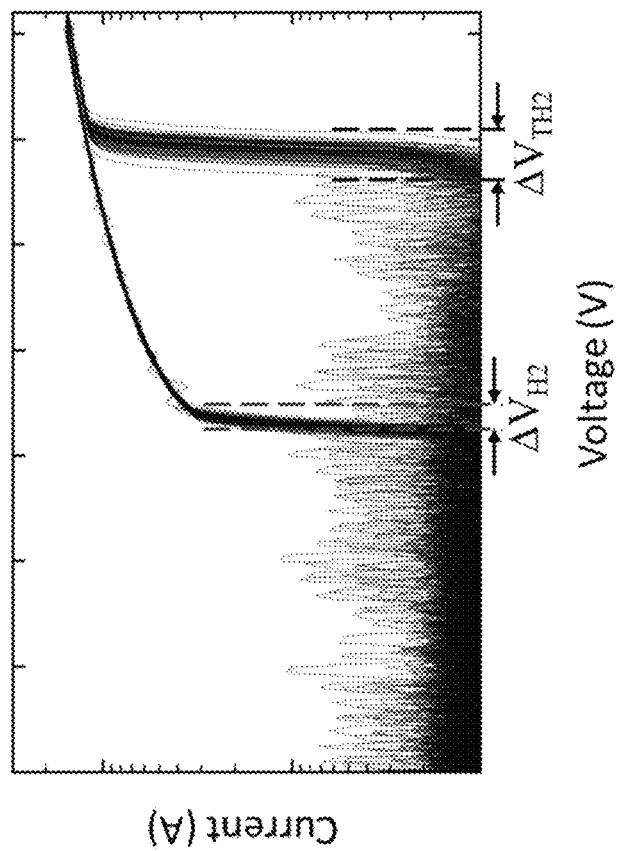
FIG. 8A and FIG. 8B are current-voltage diagrams each showing cycle-to-cycle variation of one of the test structures.
Figure 8A:
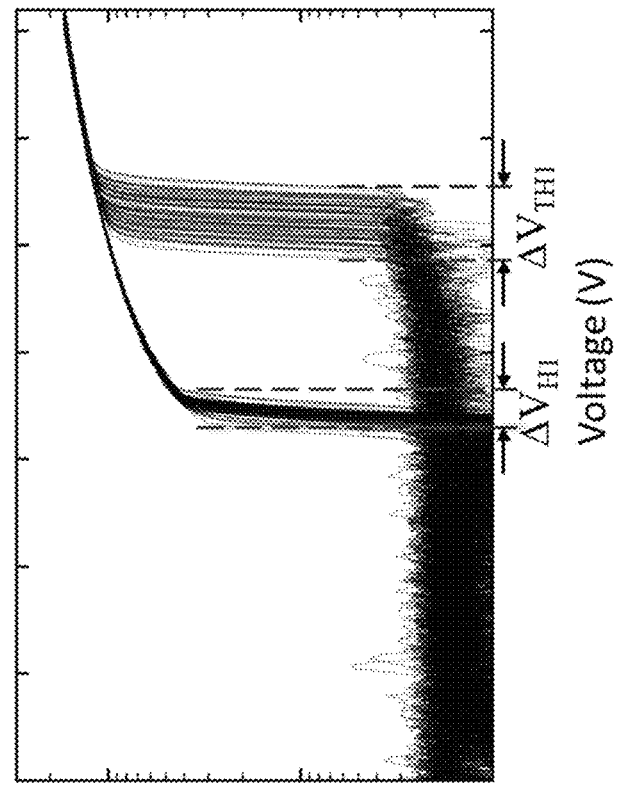

FIG. 8A and FIG. 8B are current-voltage diagrams each showing cycle-to-cycle variation of a single test structure 500.

Each loop in FIG. 8A shows operation cycles of a single test structure 500 having a switching layer formed of a GeCTe compound without nitrogen doping. Cycle-to-cycle variation of the GeCTe compound may result in threshold voltage variation $\Delta V_{TH1}$ of the test structure 500 under repeated operations. Similarly, cycle-to-cycle variation of the GeCTe compound may result in holding voltage variation $\Delta V_{H1}$ of the test structure 500 under repeated operations.

Each loop in FIG. 8B shows operation cycles of a single test structure 500 having a switching layer formed of a nitrogen doped GeCTe compound. As compared to the cycle-to-cycle variation shown in FIG. 8A, the test structure 500 having the switching layer formed of the nitrogen doped GeCTe compound exhibits much less cycle-to-cycle variation, as shown in FIG. 8B. Particularly, a threshold voltage variation $\Delta V_{TH2}$ shown in FIG. 8B is less than the threshold voltage variation $\Delta V_{TH1}$ as shown in FIG. 8A, and a holding voltage variation $\Delta V_{H2}$ shown in FIG. 8B is less than the holding voltage variation $\Delta V_{H1}$ as shown in FIG. 8A as well. Therefore, incorporating nitrogen into a GeCTe compound for forming switching layers of OTS selectors can reduce cycle-to-cycle variation and have better operation repeatability and device stability.

Figure 9:
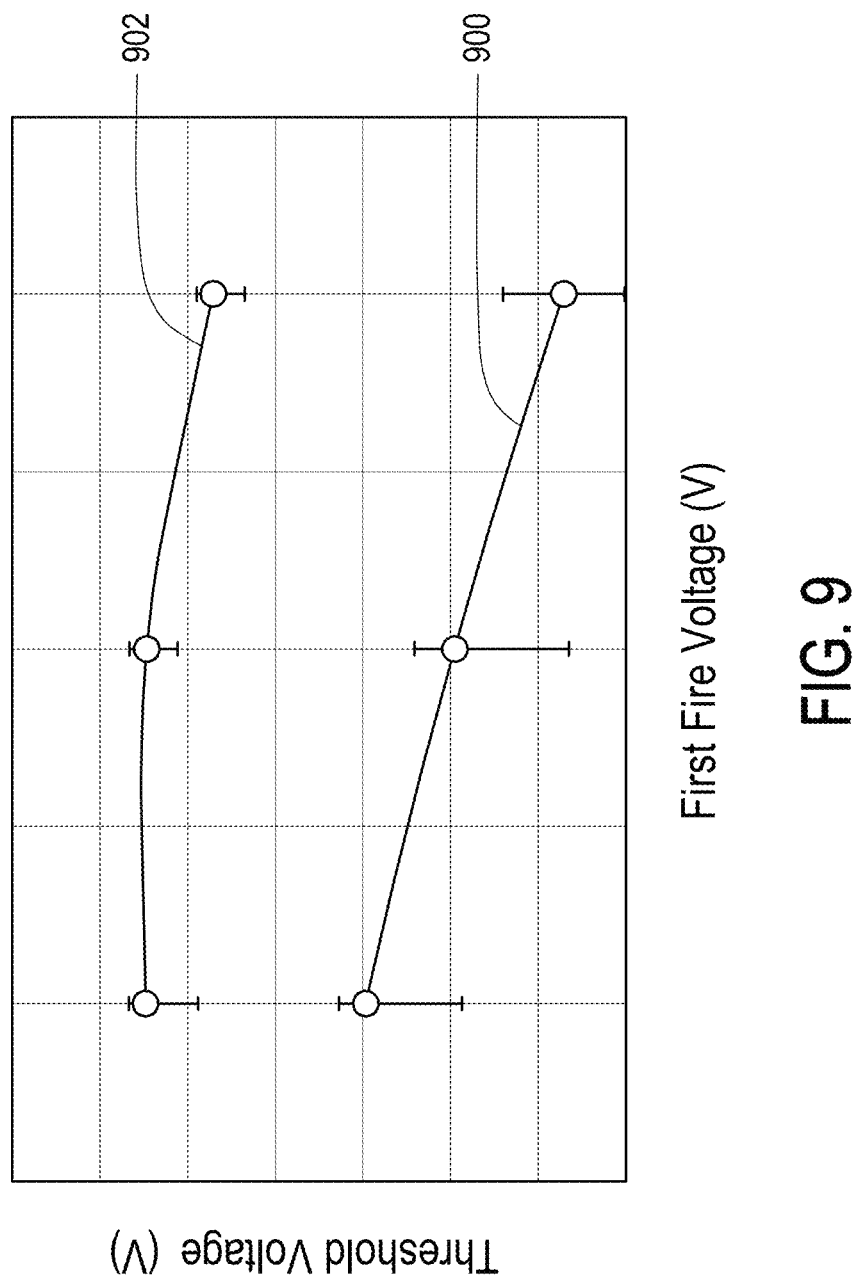
FIG. 9 is a diagram showing threshold voltage stability of two test structures in corresponding to increasing first fire voltage applied to these test structures.

FIG. 9 is a diagram showing threshold voltage stability of two of the test structures 500 in corresponding to increasing first fire voltage applied to these test structures 500.

Referring to FIG. 9, a data line 900 shows threshold voltage variation of a test structure 500 having a switching layer 506 formed of a GeCTe compound (without nitrogen doping), with respect to increasing first fire voltage applied across this test structure 500. In addition, a data line 902 shows threshold voltage variation of another test structure 500 having a switching layer 506 formed of a nitrogen doped GeCTe compound, with respect to increasing first fire voltage applied across this test structure 500. As the data lines 900, 902 indicate, the test structure 500 with the switching layer 506 formed of the nitrogen doped GeCTe compound exhibits less threshold voltage degradation than the test structure 500 with the switching layer formed of the GeCTe compound does, in corresponding to the increase of the first fire voltage. Without being bound to or limited by any theory or model, it is possible that the nitrogen doped GeCTe compound is more structurally robust than the GeCTe compound without nitrogen doping, thus can be less susceptible to damages resulted from high first fire voltage than the GeCTe compound without nitrogen doping is.

Figure 10:
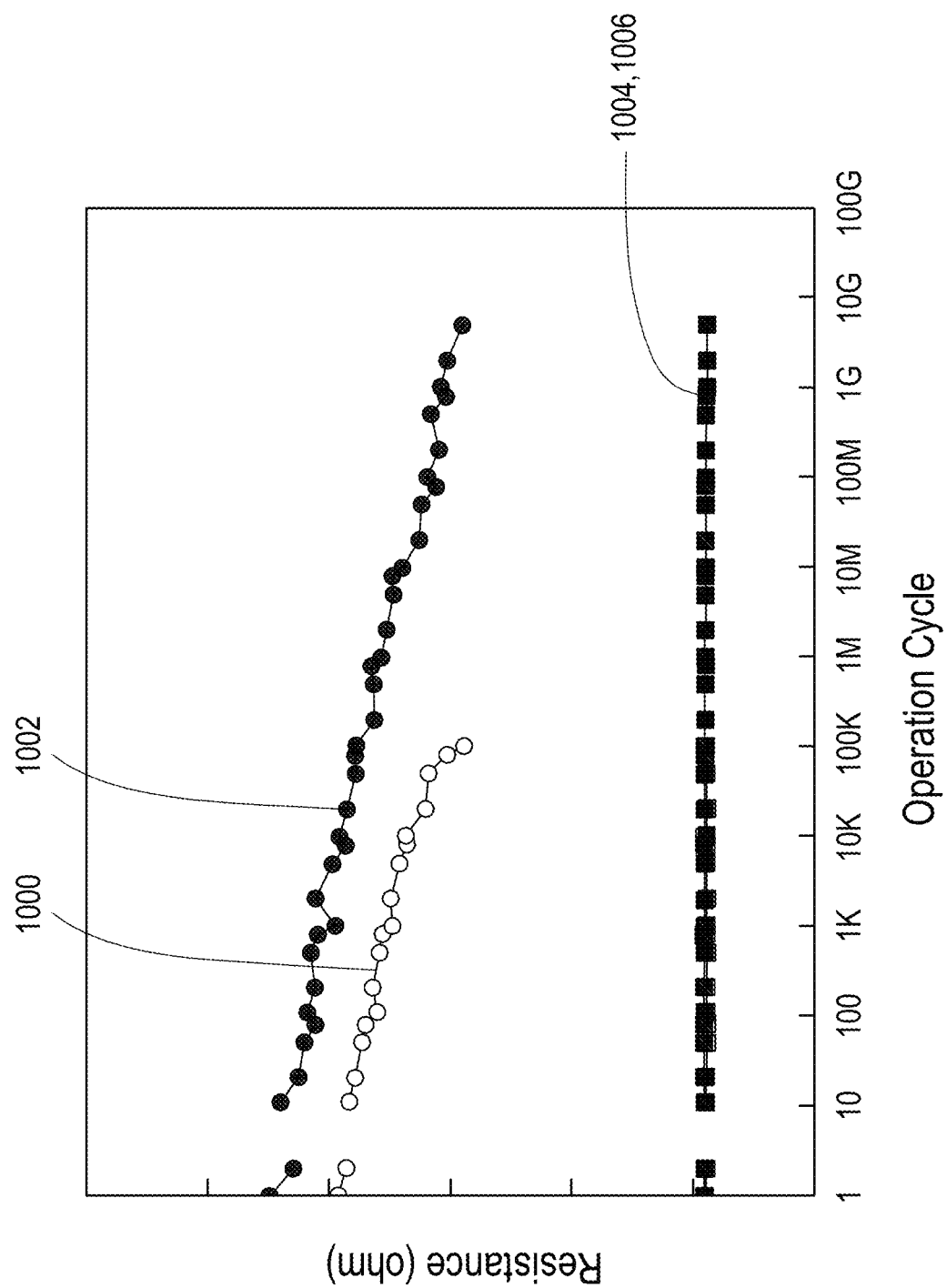
FIG. 10 is a diagram showing variations of on-resistance and off-resistance of two test structures during repeated operations of these test structures.

FIG. 10 is a diagram showing variations of on-resistance and off-resistance of two test structures 500 during repeated operations of these test structures 500 under identical turn-on (compliance) current (e.g., 500 μA).

Referring to FIG. 10, a data line 1000 shows variation of off-resistance of a test structure 500 having a switching layer 506 formed of a GeCTe compound (without nitrogen doping), and a data line 1002 shows variation of off-resistance of another test structure 500 having a switching layer 506 formed of a nitrogen doped GeCTe compound. The off-resistance described in the present disclosure refers to the resistance across an OTS selector when the OTS selector is in an off state. As the data line 1000 indicates, the off-resistance of the test structure 500 having the switching layer 506 formed of the GeCTe compound decreases during repeated operations, and may abruptly drop after $10^5$ operation cycles that an off-current passing through the test structure 500 reaches a pre-determined compliance value (e.g., 500 µA) and the off-state can no longer recover. On the other hand, as the data line 1002 indicates, off-resistance of the test structure 500 having the switching layer 506 formed of the nitrogen doped GeCTe compound does not abruptly drop even after $10^9$ operation cycles. Therefore, as also indicated by FIG. 9, the nitrogen doped GeCTe compound may exhibit greater electrical robustness over the GeCTe compound without nitrogen doping.

Further, almost coincident data lines 1004, 1006 show on-resistance variations of the test structure 500 having the switching layer 506 formed of the GeCTe compound (without nitrogen doping) and the test structure 500 having the switching layer 506 formed of the nitrogen doped GeCTe compound. The on-resistance described herein refers to the resistance across an OTS selector when the OTS selector is turned on. As indicated by the data lines 1004, 1006, both test structures 500 exhibit substantially constant on-resistance during repeated operations.

As described above, incorporating nitrogen into a GeCTe compound for forming a switching layer of an OTS selector may increase thermal stability as well as electrical endurance of the OTS selector, reduce off-current of the OTS selector while avoiding from raising a threshold voltage of the OTS selector, and enhance electrical robustness of the OTS selector. Further, a cycle-to-cycle variation among repeated operations can be effectively reduced by incorporating nitrogen into a GeCTe compound for forming switching layers of the OTS selector. These improvements may be resulted from a robust network structure cross-linking different elements in the nitrogen doped GeCTe compound, as described with reference to FIG. 4A through FIG. 4D. Further, the robust network structure of the nitrogen doped GeCTe compound may be supported by lower crystallinity of the nitrogen doped GeCTe compound, as compared to the GeCTe compound without nitrogen doping.

Figure 11:
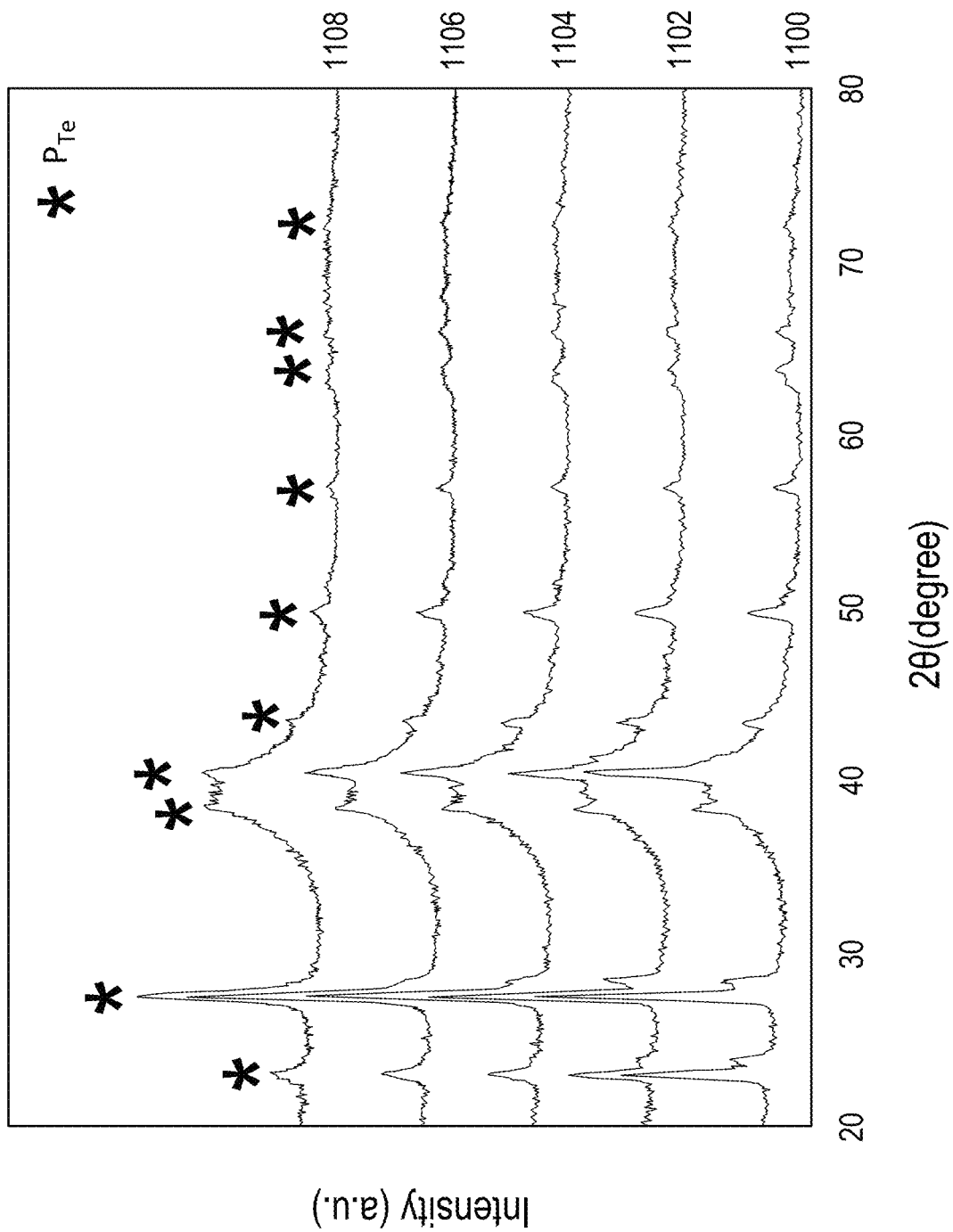
FIG. 11 is a diagram showing X-ray diffraction (XRD) patterns of GeCTe compounds doped with various amount of nitrogen.

FIG. 11 is a diagram showing X-ray diffraction (XRD) patterns of GeCTe compounds doped with various amount of nitrogen.

Referring to FIG. 11, patterns 1100, 1102, 1104, 1106, 1108 are plots of X-ray diffraction patterns of thin films formed of GeCTe compounds having various amount of nitrogen. These thin films are covered by tungsten protection layers, and are annealed at 400° C. for 10 minutes. The bottommost pattern 1100 corresponds to a GeCTe compound with zero amount of nitrogen (i.e., a GeCTe compound without nitrogen doping). On the other hand, the patterns 1102, 1104, 1106, 1108 correspond to nitrogen doped GeCTe compounds, and are arranged from bottom to top as amount of nitrogen doping increases. Diffraction peaks $P_{Te}$ of these patterns 1100-1108 are identified as diffraction peaks of tellurium crystalline phase(s). In addition, a broadened peak around 40 degree may correspond to a tungsten crystalline phase. As indicated by the patterns 1100-1108, the diffraction peaks $P_{Te}$ are lowered as nitrogen doping in the GeCTe compound increases. Such reduction in formation of the tellurium crystalline phase(s) may support that incorporating nitrogen into a GeCTe compound may result in lower crystallinity of the nitrogen doped GeCTe compound, which may reveal that the nitrogen doped GeCTe compound has a rather strong structural network.

Following the concept of enhancing structural network and lowering crystallinity, other candidates are provided for incorporating into a GeCTe compound. In some embodiments, silicon is selected for incorporating into a GeCTe compound. An electronegativity difference between silicon and tellurium is greater than an electronegativity difference between germanium and tellurium, suggesting stronger Si—Te bond than Ge—Te bond. Some of tellurium atoms may bond with silicon atoms, while others of the tellurium atoms may still bond with germanium atoms (as described with reference to FIG. 4B and FIG. 4D). Since the tellurium atoms are further bonded with the silicon atoms in a structural network, it becomes harder for tellurium crystalline phase to growth. Therefore, the silicon doped GeCTe compound may more readily maintain amorphous or low crystallinity.

Figure 12:
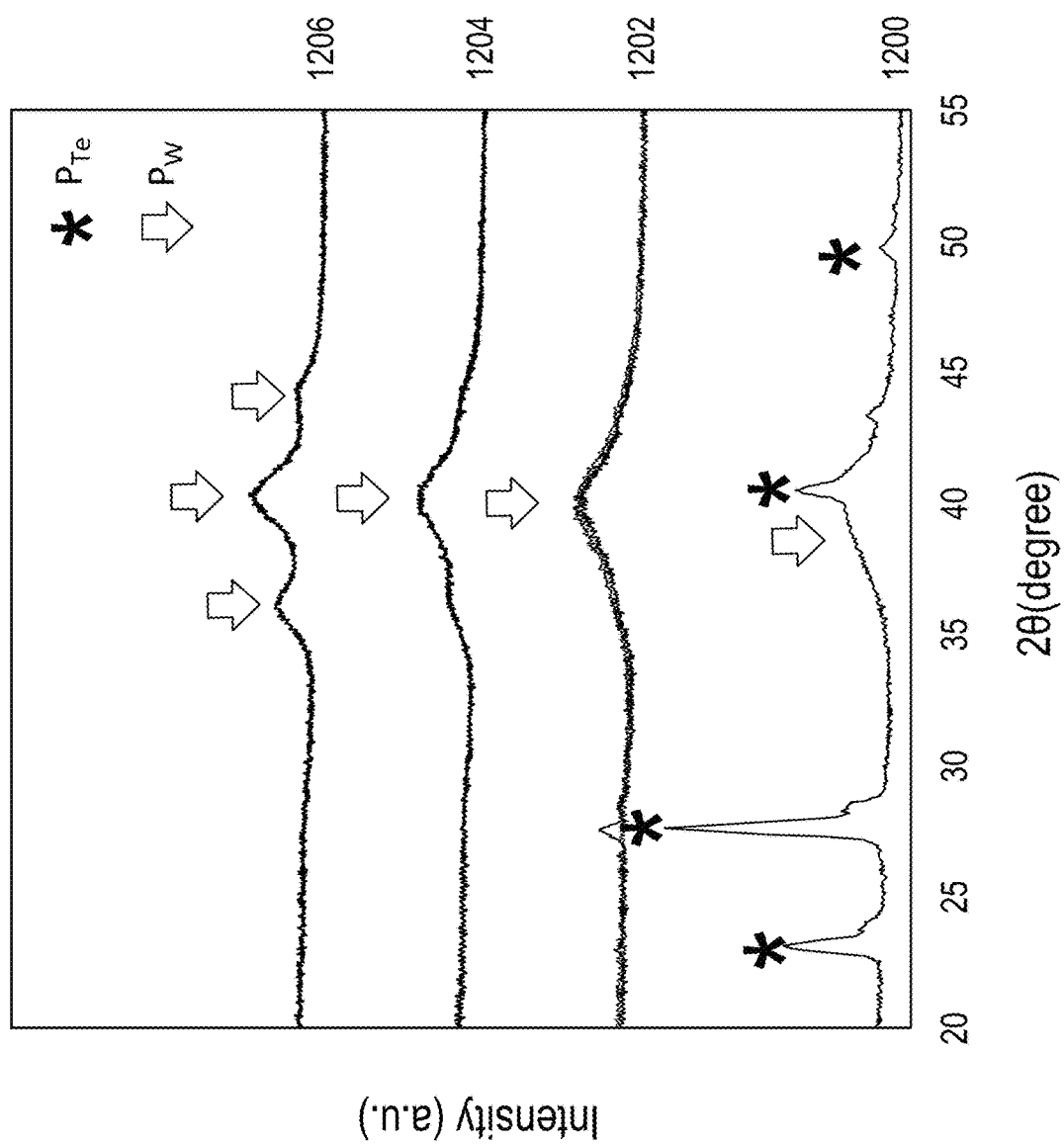
FIG. 12 is a diagram showing X-ray diffraction (XRD) patterns of GeCTe compounds doped with various amount of silicon.

FIG. 12 is a diagram showing X-ray diffraction (XRD) patterns of GeCTe compounds doped with various amount of silicon.

Referring to FIG. 12, patterns 1200, 1202, 1204, 1206 are plots of intensity of X-ray scattered at different angles by thin films formed of GeCTe compounds having various amount of silicon. These thin films are covered by tungsten protection layers, and are annealed at 400° C. for 10 minutes. The bottommost pattern 1200 corresponds to a GeCTe compound with zero amount of silicon (i.e., a GeCTe compound without silicon doping). On the other hand, the patterns 1202, 1204, 1206 correspond to silicon doped GeCTe compounds, and are arranged from bottom to top as amount of silicon doping increases. The diffraction peaks $P_{Te}$ as also shown in FIG. 11 indicate a tellurium crystalline phase. In addition, diffraction peaks $P_W$ indicate a tungsten crystalline phase. As shown in FIG. 12, the diffraction peaks $P_{Te}$ appear on the pattern 1200 corresponding to the GeCTe compound without silicon doping, but are absent on the patterns 1202, 1204, 1206 corresponding to the silicon doped GeCTe compound. In other words, growth of the tellurium crystalline phase may be suppressed by silicon doping, and the silicon doped GeCTe compound may maintain amorphous or very low crystallinity even after being annealed. Such reduction of crystallinity may reveal that the silicon doped GeCTe compound has a stronger structural network over the GeCTe compound without silicon doping, and the silicon doped GeCTe compound may have outstanding thermal stability and electrical performance, as similar to the nitrogen doped GeCTe compound. For instance, incorporating silicon into a GeCTe compound for forming a switching layer of an OTS selector may increase thermal stability as well as electrical endurance of the OTS selector, reduce off-current of the OTS selector while avoiding from raising a threshold voltage of the OTS selector, and enhance electrical robustness of the OTS selector. Further, a cycle-to-cycle variation among repeated operations can be effectively reduced by incorporating silicon into a GeCTe compound for forming switching layer of the OTS selector.

The silicon doped GeCTe compound can be represented by $Si_W Ge_X C_Y Te_Z$, where "W" indicates an atomic ratio of silicon, "X" indicates an atomic ratio of germanium, "Y" indicates an atomic ratio of carbon, and "Z" indicates an atomic ratio of tellurium. A summation of "W", "X", "Y", "Z" equals to 1. In those embodiments where an OTS selector having a switching layer formed of $Si_W Ge_X C_Y Te_Z$ and exhibiting such outstanding performances (i.e., high thermal stability, high electrical endurance, low off-current, strong electrical robustness, and low cycle-to-cycle variation), "W" may range from about 0.03 to about 0.40, "X" may range from about 0.05 to about 0.20, "Y" may range from about 0.10 to about 0.30, and "Z" may range from about 0.25 to about 0.60. Further, a thickness of such switching layer may range from 3 nm to 50 nm.

In some embodiments, a sputtering process is used for forming a layer of a silicon doped GeCTe compound. A silicon target, a germanium target and a tellurium carbide target may be provided in a chamber for performing the sputtering process. In addition, a sputtering gas (such as including argon gas) may be introduced into the chamber. The sputtering gas is ionized and strikes the targets, thus atoms in these targets are ejected and deposited on a workpiece loaded in the chamber. These atoms may include silicon atoms from the silicon target, germanium atoms from the germanium target and tellurium as well as carbon atoms from the tellurium carbide target. Further, an in-situ substrate heating may be performed during the sputtering process, and/or a post deposition annealing process may be performed on the deposited layer of the silicon doped GeCTe compound.

Furthermore, in yet other embodiments, nitrogen is incorporated into a silicon doped GeCTe compound. In other words, both nitrogen and silicon are adopted for doping into a GeCTe compound. The GeCTe compound doped with nitrogen and silicon can be represented by $N_V Si_W Ge_X C_Y Te_Z$, where "V" indicates an atomic ratio of nitrogen, "W" indicates an atomic ratio of silicon, "X" indicates an atomic ratio of germanium, "Y" indicates an atomic ratio of carbon, and "Z" indicates an atomic ratio of tellurium. A summation of "V", "W", "X", "Y", "Z" equals to 1. In those embodiments where an OTS selector having a switching layer formed of $N_V Si_W Ge_X C_Y Te_Z$ and exhibiting such outstanding performances (i.e., high thermal stability, high electrical endurance, low off-current, strong electrical robustness, and low cycle-to-cycle variation), a summation of "V" and "W" may range from about 0.03 to about 0.40, "X" may range from about 0.05 to about 0.20, "Y" may range from about 0.10 to about 0.30, "Z" may range from about 0.25 to about 0.60. Composition analysis result shows that amount of silicon in a GeCTe compound doped with nitrogen and silicon decreases as amount of nitrogen increases, while a total amount of nitrogen and silicon remains substantially constant. Such result may suggest that nitrogen further incorporated into a silicon doped GeCTe compound may at least partially substitute silicon in the silicon doped GeCTe compound. A ratio of "V" in $N_V Si_W Ge_X C_Y Te_Z$ over a summation of "V" and "W" in $N_V Si_W Ge_X C_Y Te_Z$ (i.e., "V"/("V"+"W")) may range from about 0.2 to about 0.55. In those embodiments an OTS selector having a switching layer formed of $N_V Si_W Ge_X C_Y Te_Z$ and exhibiting such outstanding performances, "V" may range from about 0.006 to about 0.22, "W" may range from about 0.0135 to about 0.32, "X" may range from about 0.05 to about 0.20, "Y" may range from about 0.10 to about 0.30, "Z" may range from about 0.25 to about 0.60. Further, a thickness of such switching layer may range from 3 nm to 50 nm.

In some embodiments, a sputtering process is used for forming a layer of a GeCTe compound doped with nitrogen and silicon. A silicon target, a germanium target and a tellurium carbide target may be provided in a chamber for performing the sputtering process. In addition, a nitrogen gas and a sputtering gas (such as including argon gas) may be introduced into the chamber. The nitrogen gas is ionized in the chamber, and may selectively react with the germanium target and more preferentially with the silicon target, such that a surface portion of the silicon target (or the germanium target and the silicon target) may be nitrided. On the other hand, the sputtering gas is ionized and strikes the targets, thus atoms in these targets are ejected and deposited on a workpiece loaded in the chamber. These atoms may include silicon and nitrogen atoms from the silicon target, germanium atoms (or germanium atoms and nitrogen atoms) from the germanium target and tellurium as well as carbon atoms from the tellurium carbide target. Further, a post deposition annealing process may be performed on the deposited layer of the GeCTe compound doped with nitrogen and silicon.

Alternatively, only the sputtering gas is introduced into the chamber. Due to absence of nitrogen source, a deposited layer is formed of a silicon doped GeCTe compound. After the sputtering process, the deposited layer of the silicon doped GeCTe compound may be subjected to a nitridation process, and the silicon doped GeCTe compound may be further incorporated with nitrogen to form the GeCTe compound doped with nitrogen and silicon. As an example, nitrogen radicals generated from nitrogen plasma may be used for the nitridation process, or the as-deposited SiGeCTe compound may be directly subjected to nitrogen plasma treatment for further incorporating nitrogen. Further, a post annealing process may or may not be further performed on the GeCTe compound doped with nitrogen and silicon. In yet other embodiments, the silicon target may be replaced by a silicon nitride target, or the germanium target may be replaced by a germanium nitride target. In these embodiments, nitrogen gas may not be introduced into the chamber for performing the sputtering process, and a deposited layer is formed of a GeCTe compound doped with nitrogen and silicon. Further, a post deposition annealing process may be performed on the deposited layer of the GeCTe compound doped with nitrogen and silicon.

The GeCTe compound doped with at least one of nitrogen and silicon is selected for forming the switching layer 116 of the selector 110, as described with reference to FIG. 1B. In addition, a plurality of the memory cells 100 each including the selector 110 are connected to form the memory array 10 as described with reference to FIG. 1A. In some embodiments, the memory array 10 is an embedded memory array, and is formed in a back-end-of-line (BEOL) structure in a semiconductor chip.

Figure 13:
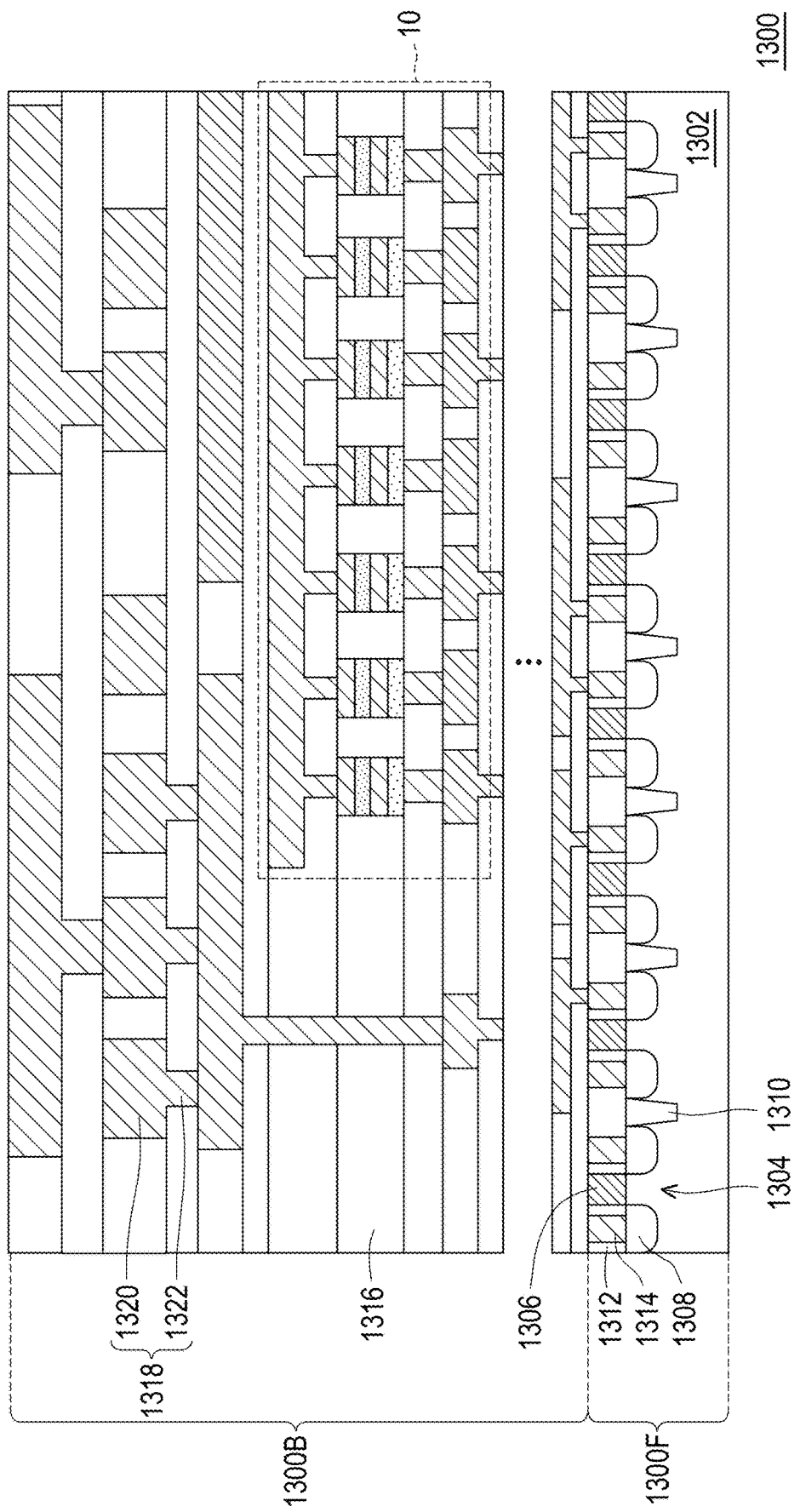
FIG. 13 is a schematic cross-sectional view illustrating a semiconductor chip with a memory array embedded therein, according to some embodiments of the present disclosure.

FIG. 13 is a schematic cross-sectional view illustrating a semiconductor chip 1300 with the memory array 10 (shown in FIG. 1A) embedded therein, according to some embodiments of the present disclosure.

Referring to FIG. 13, the semiconductor chip 1300 may have a front-end-of-line (FEOL) structure 1300F built on a semiconductor substrate 1302. The FEOL structure 1300F may include transistors 1304. Each of the transistors 1304 may include a gate structure 1306 and a pair of source/drain structures 1308 at opposite sides of the gate structure 1306. Further, adjacent transistors 1304 may be isolated from one another by an isolation structure 1310 formed in the semiconductor substrate 1302. In some embodiments, the transistors 1304 are planar type transistors. In these embodiments, the gate structures 1306 are formed on planar portions of the semiconductor substrate 1302, and the source/drain structures 1308 may be formed in the semiconductor substrate 1302. In alternative embodiments, the transistors 1304 are fin type transistors or gate-all-around (GAA) transistors. In these alternative embodiments, the semiconductor substrate 1302 may be shaped to form fin structures at its top surface, or stacks of channel structures (e.g., stacks of semiconductor nanosheets) may be formed on the semiconductor substrate 1302. Each fin structure/channel structure may extend between a pair of the source/drain structures 1308. In addition, the gate structures 1306 may intersect and cover the fine structures or the stacks of channel structures. Moreover, the FEOL structure 1300F may further include a dielectric layer 1312 and contact structures 1314 formed in the dielectric layer 1312. The contact structures 1314 penetrate through the dielectric layer 1312, to establish electrical contact with the source/drain structures 1308.

The memory array 10 may be embedded in a back-end-of-line (BEOL) structure 1300B formed on the FEOL structure 1300F. The BEOL structure 60B may include a stack of interlayer dielectric layers 1316. For conciseness, only one of the interlayer dielectric layers 1316 is labeled. The memory array 10 is formed in successive ones of the interlayer dielectric layers 1316. Further, the BEOL structure 1300B also includes conductive elements 1318 spreading in the stack of interlayer dielectric layers 1316, for interconnecting the transistors 1304, and for out-routing the memory array 10. The conductive elements 1318 may be distributed below, around and over the memory array 10, and may include conductive patterns 1320 and conductive vias 1322. Each conductive pattern 1320 laterally extends in one of the interlayer dielectric layers 1316. In addition, each conductive via 1322 vertically extends through one or more of the interlayer dielectric layers 1316 to establish electrical contact with one or more of the conductive patterns 1320, or to establish electrical contact with one of the signal lines in the memory array 10 (i.e., one of the first signal lines SL1 or one of the second signal lines SL2). The memory array 10 may be routed to some of the transistors 1304 in the FEOL structure 1300F through some of the conductive elements 1318, and can be driven by a driving circuit including these transistors 1304.

Although the conductive elements 1318 below the memory array 10 are depicted as being connected to the conductive elements 1318 above the memory array 10 through a long conductive via 1322 penetrating through multiple interlayer dielectric layers 1316, such long conductive via 1322 may be alternatively replaced by a combination of short conductive vias 1322 and some conductive patterns 1320. The present disclosure is not limited to the arrangement of the conductive elements 1318. Further, although not shown, passivation layer(s) and electrical connectors as chip inputs/outputs (I/Os) may be formed on the BEOL structure 1300B.

Figure 14:
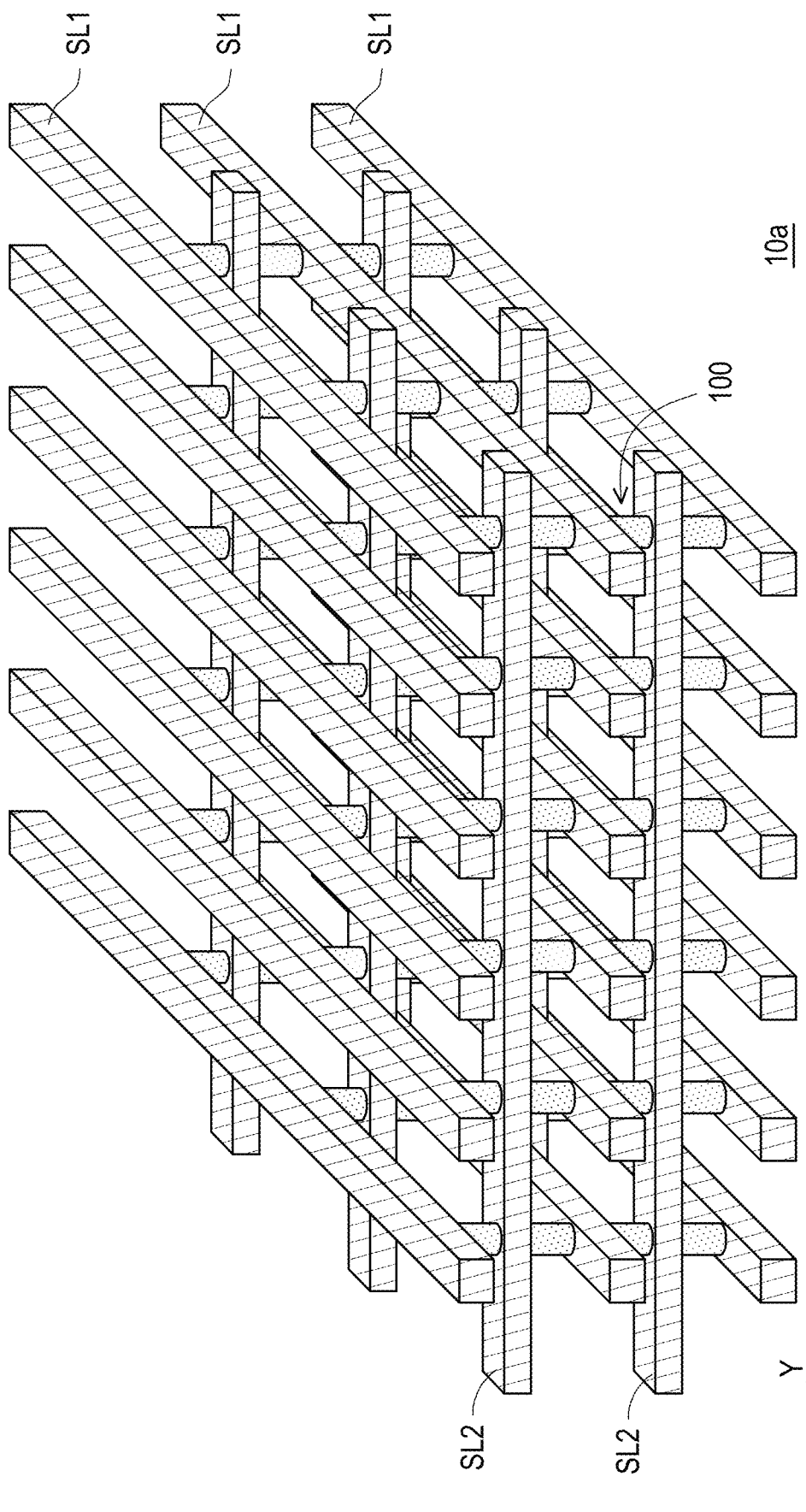
FIG. 14 is a schematic three-dimensional view illustrating a memory array, according to some embodiments of the present disclosure.

FIG. 14 is a schematic three-dimensional view illustrating a memory array 10a, according to some embodiments of the present disclosure.

The memory array 10 as shown in FIG. 1A includes the memory cells 100 arranged at a single horizontal level. On the other hand, the memory array 10a as shown in FIG. 14 has multiple horizontal levels. As shown in FIG. 14, layers of the memory cells 100 are stacked along a vertical direction. In addition, each layer of the memory cells 100 are coupled to vertically separated layers of signal lines (i.e., a layer of first signal lines SL1 and a layer of second signal lines SL2). Layers of the first signal lines SL1 and layers of the second signal lines SL2 may be alternatively arranged along a vertical direction. Accordingly, the memory cells 100 in some layers are coupled to underlying first signal lines SL1 and overlying second signal lines SL2, while the memory cells 100 in other layers are coupled to underlying second signal lines SL2 and overlying first signal lines SL1.

In addition, vertically adjacent layers of the memory cells 100 may share the layer of signal lines extending in between. For instance, the bottommost layer of the memory cells 100 and the second bottommost layer of the memory cells 100 may share a layer of the second signal lines SL2 in between.

As being deployed along the vertical direction, the memory array 10a is no longer limited to two-dimensional design, and storage density can be significantly increased without increasing a footprint area of the memory array 10a. Each horizontal level of the memory array 10a may be defined by a layer of the memory cells 100 and the layers of the first and second signal lines SL1, SL2 connected thereto. Although the memory array 10a is depicted as having four horizontal levels, those skilled in the art may adjust an amount of the horizontal levels of the memory array 10a. For instance, the memory cell 10a may have two to ten horizontal levels. Further, as similar to the memory array 10 described with reference to FIG. 13, the memory array 10a shown in FIG. 14 may be embedded in a BEOL structure of a semiconductor chip as well.

Figure 15A:
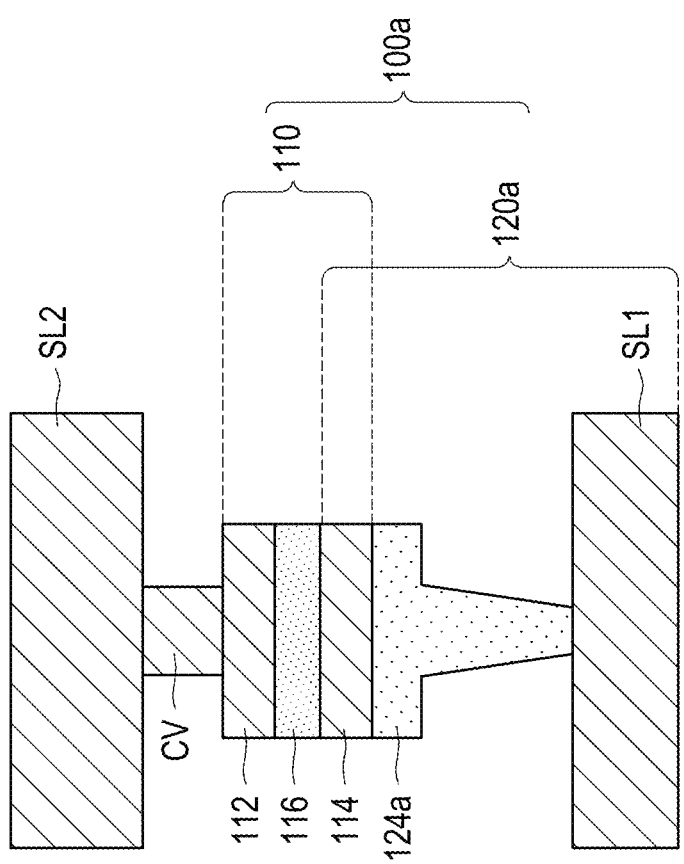
FIG. 15A is a cross-sectional view schematically illustrating a memory cell, according to some embodiments of the present disclosure.

FIG. 15A is a cross-sectional view schematically illustrating a memory cell 100a, according to some embodiments of the present disclosure. The memory cell 100a is similar to the memory cell 100 as described with reference to FIG. 1B. Therefore, only differences between the memory cells 100, 100a will be described. The same or the like parts between the memory cells 100, 100a would not be repeated again.

Referring to FIG. 15A, a resistance variable storage element 120a in a memory cell 100a may use one of the signal lines SL1, SL2 coupled to the memory cell 100a as a bottom terminal, while the electrode 114 may be functioned as a top terminal of the resistance variable storage element 120a, which is shared with the overlying selector 110. In addition, a storage layer 124a lying below the electrode 114 may further extend to the signal line as the bottom terminal of the resistance variable element 120a. For instance, as shown in FIG. 15A, the first signal line SL1 is functioned as the bottom terminal of the resistance variable storage element 120a, while the electrode 114 is functioned as the top terminal of the resistance variable storage element 120a. In addition, the storage layer 124a may have a horizontal portion lying below the electrode 114, and have a vertical portion extending from the horizontal portion to the first signal line SL1. Although not shown, the resistance variable storage element 120a in another memory cell 100a may use a second signal line SL2 as a bottom terminal, and the electrode 114 may be functioned as a top terminal of this memory cell 100a. In addition, the storage layer 124a may extend to the second signal line SL2 along a vertical direction.

Further, as similar to the memory cell 100 as described with reference to FIG. 1A and FIG. 14, a plurality of the memory cells 100a may be arranged as a two-dimensional memory array or a three-dimensional memory array. Moreover, the two-dimensional memory array or the three-dimensional memory array may be embedded in a BEOL structure of a semiconductor chip, as described with reference to FIG. 13.

Figure 15B:
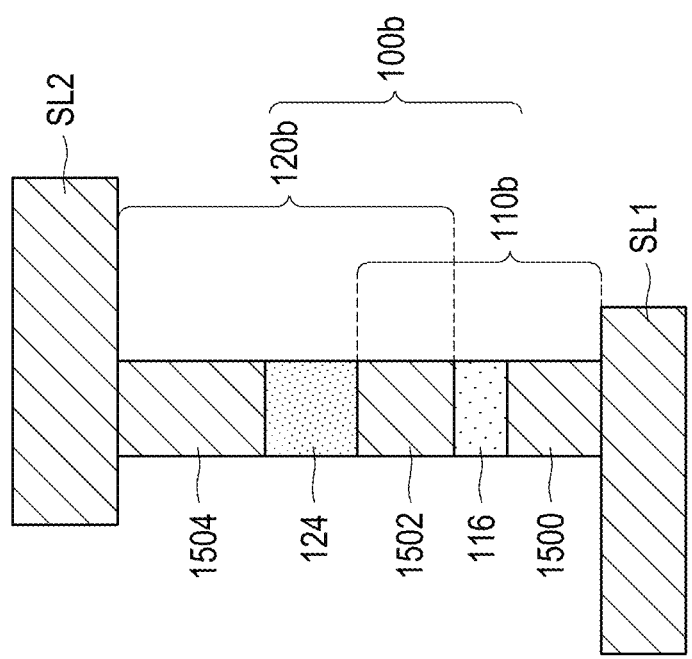
FIG. 15B is a cross-sectional view schematically illustrating a memory cell, according to some embodiments of the present disclosure.

FIG. 15B is a cross-sectional view schematically illustrating a memory cell 100b, according to some embodiments of the present disclosure. The memory cell 100b is similar to the memory cell 100 as described with reference to FIG. 1B. Therefore, only differences between the memory cells 100, 100b will be described. The same or the like parts between the memory cells 100, 100b would not be repeated again.

Referring to FIG. 15B, a resistance variable storage element 120b is stacked on a selector 110b in a memory cell 100b. Electrodes 1500, 1502 at opposite sides of the switching layer 116 are functioned as bottom and top terminals of the selector 110b, respectively. The electrode 1500 lying below the switching layer 116 and functioned as the bottom terminal of the selector 110b may extend to the signal line extending below the memory cell 100b (e.g., a first signal line SL1). On the other hand, the electrode 1502 disposed on the switching layer 116 and functioned as the top terminal of the selector 110b may be shared with the resistance variable storage element 120b. In addition to the electrode 1502 lying below the storage layer 124 and functioned as a bottom terminal of the resistance variable storage element 120, the resistance variable storage element 120b may include an electrode 1504 located on the storage layer 124 and functioned as its top terminal. The electrode 1504 may extend from a top side of the storage layer 124 to the signal line extending on the memory cell 100b (e.g., a second signal line SL2). In some embodiments, the memory cell 100b is formed in a pillar shape. In these embodiments, sidewalls of the electrodes 1500, 1502, 1504, the switching layer 116 and the storage layer 124 may be substantially coplanar with one another. In addition, a sidewall of such pillar structure is substantially flat from a top end of the pillar structure to a bottom end of the pillar structure. Further, the electrodes 1500, 1502, 1504 may be similar to the electrodes 112, 114, 122 in terms of material candidates.

Further, as similar to the memory cell 100 as described with reference to FIG. 1A and FIG. 14, a plurality of the memory cells 100b may be arranged as a two-dimensional memory array or a three-dimensional memory array. Moreover, the two-dimensional memory array or the three-dimensional memory array may be embedded in a BEOL structure of a semiconductor chip, as described with reference to FIG. 13.

As above, an OTS selector provided in the present disclosure includes a switching layer formed of a GeCTe compound doped with at least one of nitrogen and silicon. As compared to a GeSiAsSe chalcogenide compound also used for a switching layer of an OTS selector, a GeCTe chalcogenide compound is free of a toxic element arsenic, and has a much lower threshold voltage. By further incorporating nitrogen and/or silicon into the GeCTe compound, material properties of the GeCTe compound can be further altered. Particularly, the GeCTe compound doped with nitrogen and/or silicon has a stronger structural network linking different elements. As a support, the GeCTe compound doped with nitrogen and/or silicon can maintain amorphous or rather low crystallinity even after being annealed. Due to the strong structural network of the GeCTe compound doped with nitrogen and/or silicon, the OTS selector having the switching layer formed of the doped GeCTe compound within certain composition range may exhibit improved thermal stability, greater electrical endurance, reduced off-current and enhanced electrical robustness. Furthermore, a cycle-to-cycle variation among repeated operations of the OTS selector can be effectively reduced.

In an aspect of the present disclosure, a memory device is provided. The memory device comprises: memory cells, each comprising: a resistance variable storage device; and an ovonic threshold switch (OTS) selector, stacked with the resistance variable storage device and coupled to the resistance variable storage device with a shared terminal, and comprising a switching layer formed of a chalcogenide compound comprising germanium, carbon, tellurium and nitrogen, wherein nitrogen atoms establish bonding with carbon atoms and germanium atoms in the chalcogenide compound.

In another aspect of the present disclosure, a memory device is provided. The memory device comprises: first signal lines; second signal lines, running over and intersecting with the first signal lines; and memory cells, defined at intersections of the first and second signal lines, and respectively comprising: a resistance variable storage device; and an ovonic threshold switch (OTS) selector, stacked with the resistance variable storage device and coupled to the resistance variable storage device with a shared terminal, and comprising a switching layer formed of a GeCTe compound doped with silicon.

In yet another aspect of the present disclosure, a manufacturing method of a memory device is provided. The method comprises: providing first signal lines over a semiconductor substrate; providing stacking structures on the first signal lines, wherein the stacking structures respectively comprise a resistance variable device and an OTS selector stacked with the resistance variable storage device and coupled to the resistance variable storage device with a shared terminal, and the OTS selector comprises a switching layer formed of a GeCTe compound doped with nitrogen; and forming second signal lines on the stacking structures, wherein the second signal lines intersect with the first signal lines, and the stacking structures are located at intersections of the first and second signal lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   memory cells, each comprising:
      a resistance variable storage device; and
      an ovonic threshold switch (OTS) selector, stacked with the resistance variable storage device and coupled to the resistance variable storage device with a shared terminal, and comprising a switching layer formed of a chalcogenide compound comprising germanium, carbon, tellurium and nitrogen, wherein nitrogen atoms establish bonding with carbon atoms and germanium atoms in the chalcogenide compound.

2. The memory device according to claim 1, wherein the chalcogenide compound is $N_W Ge_X C_Y Te_Z$, where a summation of "W", "X", "Y", "Z" equals to 1.

3. The memory device according to claim 1, wherein a total atomic ratio of nitrogen and germanium in the chalcogenide compound ranges from about 0.10 to about 0.30.

4. The memory device according to claim 1, wherein a ratio of an atomic ratio of nitrogen in the chalcogenide compound over a total atomic ratio of nitrogen and germanium in the chalcogenide compound ranges from about 0.2 to about 0.55.

5. The memory device according to claim 1, wherein an atomic ratio of nitrogen in the chalcogenide compound ranges from about 0.02 to about 0.165, an atomic ratio of germanium in the chalcogenide compound ranges from about 0.045 to about 0.24, an atomic ratio of carbon in the chalcogenide compound ranges from about 0.1 to about 0.3, and an atomic ratio of tellurium in the chalcogenide compound ranges from about 0.5 to about 0.7.

6. The memory device according to claim 1, wherein a thickness of the switching layer ranges from about 3 nm to about 50 nm.

7. The memory device according to claim 1, wherein a sidewall of a stacking structure of the OTS selector and the resistance variable storage device is laterally recessed at an electrode of the resistance variable storage device not shared with the OTS selector.

8. The memory device according to claim 1, wherein a sidewall of a stacking structure of the OTS selector and the resistance variable storage device is laterally recessed at a lower portion of a storage layer of the resistance variable storage device.

9. The memory device according to claim 1, wherein a sidewall of a stacking structure of the OTS selector and the resistance variable device is substantially flat from a top end to a bottom end of the stacking structure.

10. A manufacturing method of a memory device, comprising:
providing first signal lines over a semiconductor substrate;
providing stacking structures on the first signal lines, wherein the stacking structures respectively comprise a resistance variable storage device and an OTS selector stacked with the resistance variable storage device and coupled to the resistance variable storage device with a shared terminal, the OTS selector comprises a switching layer formed of a GeCTe compound doped with nitrogen, and nitrogen atoms establish bonding with carbon atoms and germanium atoms in the GeCTe compound doped with nitrogen; and
forming second signal lines on the stacking structures, wherein the second signal lines intersect with the first signal lines, and the stacking structures are located at intersections of the first and second signal lines.

11. The manufacturing method of the memory device according to claim 10, wherein a method for forming the switching layer comprises a reactive sputtering process using a germanium target and a tellurium carbide target, and the germanium target is at least partially nitrided by nitrogen plasma during the reactive sputtering process.

12. The manufacturing method of the memory device according to claim 10, wherein a method for forming the switching layer comprises a sputtering process using a germanium nitride target and a tellurium carbide target.

13. The manufacturing method of the memory device according to claim 12, wherein a method for forming the switching layer comprises a sputtering process using a germanium target and a tellurium carbide target, and further comprises a nitridation process for further incorporating nitrogen into a deposited GeCTe compound.

14. The manufacturing method of the memory device according to claim 11, wherein nitrogen gas and sputtering gas are introduced and ionized during the reactive sputtering process.

15. The manufacturing method of the memory device according to claim 11, wherein nitrogen gas is not introduced during the reactive sputtering process.

16. The manufacturing method of the memory device according to claim 15, wherein the method for forming the switching layer further comprises a nitridation process for introducing nitrogen into a GeCTe compound obtained from the reactive sputtering process.

17. A memory device, comprising:
first signal lines;
second signal lines, running over and intersecting the first signal lines; and
memory cells, each defined at an intersection of one of the first signal lines and one of the second signal lines, and respectively comprising:
a resistance variable storage device; and
an ovonic threshold switch (OTS) selector, stacked with the resistance variable storage device and coupled to the resistance variable storage device with a shared terminal, and comprising a switching layer formed of a GeCTe compound doped with nitrogen, wherein nitrogen atoms establish bonding with carbon atoms and germanium atoms in the GeCTe compound doped with nitrogen.

18. The memory device according to claim 17, wherein the GeCTe compound doped with nitrogen is free of arsenic.

19. The memory device according to claim 17, wherein the resistance variable storage device has a storage layer formed of a chalcogenide compound comprising germanium, tellurium and antimony.

20. The memory device according to claim 17, wherein the resistance variable storage device includes a storage layer formed of a high-k dielectric material.

* * * * *